(12) United States Patent
Nomura et al.

(10) Patent No.: US 7,659,772 B2
(45) Date of Patent: Feb. 9, 2010

(54) SEMICONDUCTOR INTEGRATED CIRCUIT DEVICE

(75) Inventors: Masahiro Nomura, Tokyo (JP); Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 210 days.

(21) Appl. No.: 11/813,502

(22) PCT Filed: Jan. 6, 2006

(86) PCT No.: PCT/JP2006/300079
§ 371 (c)(1),
(2), (4) Date: Jul. 6, 2007

(87) PCT Pub. No.: WO2006/073176
PCT Pub. Date: Jul. 13, 2006

(65) Prior Publication Data
US 2008/0191791 A1    Aug. 14, 2008

(30) Foreign Application Priority Data
Jan. 6, 2005    (JP) ............................. 2005-001411
Jun. 8, 2005    (JP) ............................. 2005-168529

(51) Int. Cl.
*G05F 1/10*    (2006.01)
(52) U.S. Cl. ...................................... 327/544; 327/534
(58) Field of Classification Search ........................ None
See application file for complete search history.

(56) References Cited

U.S. PATENT DOCUMENTS

| | | | | |
|---|---|---|---|---|
| 5,774,404 A | * | 6/1998 | Eto | ............................. 365/222 |
| 5,859,560 A | * | 1/1999 | Matthews | .................... 327/513 |
| 6,043,681 A | * | 3/2000 | Lim | ............................. 326/81 |
| 6,967,522 B2 | * | 11/2005 | Chandrakasan et al. | ..... 327/534 |
| 7,446,549 B2 | * | 11/2008 | Tomita et al. | ................ 324/763 |
| 2001/0052623 A1 | * | 12/2001 | Kameyama et al. | .......... 257/369 |
| 2004/0016977 A1 | * | 1/2004 | Miyazaki et al. | ............. 257/393 |
| 2004/0111231 A1 | * | 6/2004 | Ando | .......................... 702/117 |

FOREIGN PATENT DOCUMENTS

JP    05-108194    4/1993

(Continued)

OTHER PUBLICATIONS

Koichi Nose, et al., "Optimization of $V_{dd}$ and $V_{th}$ for Low-Power and High-Speed Applications," Institute of Industrial Science, University of Tokyo, Japan, pp. 469-474.

Tadahiro Kuroda, et al., "Variable Supply-Voltage Scheme for Low-Power High-Speed CMOS Digital Design," IEEE Journal of Solid-State Circuits, vol. 33, No. 3, Mar. 1998, pp. 454-462.

*Primary Examiner*—Cassandra Cox
(74) *Attorney, Agent, or Firm*—Dickstein Shapiro LLP

(57) ABSTRACT

A semiconductor integrated circuit device includes: a switching current observer for observing a switching current; a leakage current observer for observing a leakage current; a comparator which compares the switching current and the leakage current with each other; a threshold voltage controller for controlling a substrate bias voltage in order to make a ratio of the switching current and the leakage current constant; a delay observer for observing a delay amount; and a power supply voltage controller for controlling a power supply voltage in order to keep the delay amount in a predetermined range. In the semiconductor integrated circuit device, a process which enables the minimization of an operation power is carried out by controlling the threshold voltage to make the ratio of the switching current and the leakage current constant at a given clock frequency and controlling the power supply voltage to guarantee the operating speed.

77 Claims, 29 Drawing Sheets

FOREIGN PATENT DOCUMENTS

| | | |
|---|---|---|
| JP | 09-214322 | 8/1997 |
| JP | 2001-345693 | 12/2001 |
| JP | 2003-324158 | 11/2003 |
| JP | 2004-171730 | 6/2004 |
| JP | 2004-207749 | 7/2004 |
| JP | 2008005174 A * | 1/2008 |

* cited by examiner

| STATE IN PREVIOUS TIME SEL(−1) | D−3 | D−2 | D−1 | D1 | D2 | SEL (0) | PRESENT STATE AND OPERATION |
|---|---|---|---|---|---|---|---|
| $V_{TH}$ CONTROL  SEL(−1)=0 | 0 | 0 | 0 | 0 | 0 | 1 | $V_{DD}$ Up, Error |
| | 1 | 0 | 0 | 0 | 0 | 1 | $V_{DD}$ Up |
| | 1 | 1 | 0 | 0 | 0 | 0 | ($V_{TH}$ Control) |
| | 1 | 1 | 1 | 0 | 0 | 0 | ($V_{TH}$ Control) |
| | 1 | 1 | 1 | 1 | 0 | 0 | ($V_{TH}$ Control) |
| | 1 | 1 | 1 | 1 | 1 | 1 | $V_{DD}$ Down |
| $V_{DD}$ CONTROL  SEL(−1)=1 | 0 | 0 | 0 | 0 | 0 | 1 | $V_{DD}$ Up, Error |
| | 1 | 0 | 0 | 0 | 0 | 1 | $V_{DD}$ Up |
| | 1 | 1 | 0 | 0 | 0 | 1 | $V_{DD}$ Up |
| | 1 | 1 | 1 | 0 | 0 | 0 | ($V_{TH}$ Control) |
| | 1 | 1 | 1 | 1 | 0 | 1 | $V_{DD}$ Down |
| | 1 | 1 | 1 | 1 | 1 | 1 | $V_{DD}$ Down |

FIG. 54

SEMICONDUCTOR INTEGRATED CIRCUIT DEVICE

TECHNICAL FIELD

The present invention relates to a semiconductor integrated circuit device which operates in synchronism with a clock, and more particularly to a semiconductor integrated circuit device which is capable of changing at least one of a power supply voltage, a clock frequency, and a threshold value.

BACKGROUND ART

Semiconductor integrated circuit devices which are predominant at present comprise an integrated assembly of CMOS (Complementary Metal-Oxide Semiconductor) transistors. The semiconductor integrated circuit device has such a tendency that its power consumption increases as the number of transistors which makes up the semiconductor integrated circuit increases. There has been a strong demand for a reduction in the power consumption of the semiconductor integrated circuit device. With the development in recent years of the low-power CMOS device technology, there has been proposed a power supply control scheme for reducing the power consumption of a semiconductor integrated circuit device by supplying a required minimum power supply voltage to each circuit block of the semiconductor integrated circuit device. For example, T. Kuroda et al. have proposed a power supply control scheme for dynamically controlling a power supply voltage in order to equalize a critical path delay to a lower limit entering a clock cycle in a semiconductor integrated circuit device [T. Kuroda, K. Suzuki, S. Mita, T. Fujita, F. Yamane, F. Sano, A. Chiba, Y. Watanabe, K. Matsuda, T. Maeda, T. Sakurai, and T. Furuyama; "Variable Supply-Voltage Scheme for Low-Power High-Speed CMOS Digital Design," IEEE Journal of Solid-State Circuits, vol. 33, pp. 454-462, March 1998]. In the semiconductor integrated circuit device to which the scheme of Kuroda et al. is applied, a reference current for controlling a threshold voltage is fixed to a leak current value as a target in a transistor device. Therefore, there is no optimization of the threshold voltage in this semiconductor integrated circuit device.

With semiconductor devices being progressively scaled, the proportion of a leakage power in the total power consumption of a semiconductor device is growing. The leakage power refers to an electric power consumed due to a leakage current in the semiconductor device. K. Nose et al. have reported that it is effective to set the proportion of a leakage power in the total power to 30% at maximum [K. Nose, and T. Sakurai; "Optimization of $V_{DD}$ and $V_{TH}$ for Low-Power and High-Speed Applications," ASP-DAC, pp. 469-474, January 2000]. The results accomplished by K. Nose et al. are based on a theoretical analysis, and they have not clearly specified how to realize such a semiconductor integrated circuit device.

JP-A-2001-345693 discloses a semiconductor integrated circuit device in which an association table (TBL) representing a combination of clock frequencies, power supply voltages, and substrate bias voltages is prepared in advance, and the clock frequency, power supply voltage, and substrate bias voltage can be controlled by referring to the association table. It should be noted that JP-A-2001-345693 corresponds to the specifications of U.S. Pat. No. 6,774,705 and U.S. Pat. No. 6,943,613.

DISCLOSURE OF THE INVENTION

Problems to be Solved by the Invention:

For reducing the power consumption of a semiconductor integrated circuit device, it is important not only to control a power supply voltage, but also to control a threshold voltage.

In the semiconductor integrated circuit device disclosed in JP-A-2001-345693, the power supply voltage and the substrate bias voltage are controlled, and the substrate bias voltage is controlled to change the threshold voltage. However, the disclosed semiconductor integrated circuit device is problematic in that since the association table is employed, data relative to a combination of power supply voltages and substrate bias voltages are required in advance. The power supply voltage and the substrate bias voltage for minimizing the power consumption of the semiconductor integrated circuit device differ from semiconductor integrated circuit device to semiconductor integrated circuit device due to various factors involved in the fabrication process for semiconductor integrated circuit devices. Therefore, the data of the association table need to be determined based on actually measured values. Preparing a large amount of association table data greatly complicates the fabrication process for semiconductor integrated circuit devices, and increases the manufacturing cost of the semiconductor integrated circuit devices.

It is an object of the present invention to provide a semiconductor integrated circuit device which is capable of optimizing a power supply voltage and a threshold voltage for minimizing an operational power with respect to a given operation clock frequency either without an association table or with a small number of association table data.

Means for Solving the Problems:

A semiconductor integrated circuit device according to the present invention includes: switching current observation means for observing a switching current in the semiconductor integrated circuit device; leakage current observation means for observing a leakage current in the semiconductor integrated circuit device; comparing means for comparing the switching current and the leakage current with each other; and threshold voltage control means for controlling a threshold voltage of a circuit element of the semiconductor integrated circuit device to make the ratio of the switching current and the leakage current constant.

In the semiconductor integrated circuit device, it is possible to minimize the operating power by controlling the threshold voltage to make the ratio of the switching current and the leakage current constant at a given clock frequency.

Another semiconductor integrated circuit device according to the present invention includes: switching current observation means for observing a switching current in the semiconductor integrated circuit device; leakage current observation means for observing a leakage current in the semiconductor integrated circuit device; comparing means for comparing the switching current and the leakage current with each other; threshold voltage control means for controlling a threshold voltage of a circuit element of the semiconductor integrated circuit device to make the ratio of the switching current and the leakage current constant; delay observation means for observing a delay amount in the semiconductor integrated circuit device; and power supply voltage control means for controlling a power supply voltage used to operate the semiconductor integrated circuit device in order to keep the delay amount in a predetermined range.

In the semiconductor integrated circuit device, the threshold voltage is controlled to make the ratio of the switching current and the leakage current constant at a given clock frequency, and the power supply voltage is controlled to guarantee the operating speed, thus making it possible to minimize the operating power while guaranteeing the operating speed.

In the present invention, the switching current observation means, the leakage current observation means, and the delay observation means comprise circuit elements that are identical in construction to those used in each of circuit blocks for performing functions of the semiconductor integrated circuit device, for example. The switching current observation means, the leakage current observation means, and the delay observation means should preferably be fabricated, in the semiconductor integrated circuit device, simultaneously with those circuit blocks by the same fabrication process as each circuit block. With this arrangement, the switching current observed by the switching current observation means, the leakage current observed by the leakage current observation means, and the delay amount observed by the delay observation means are representative of switching currents, leakage currents, and delay amounts in the respective circuit blocks of the semiconductor integrated circuit device regardless of manufacturing variations of the semiconductor integrated circuit device.

In the present invention, circuit elements to be controlled for the threshold voltage are, for example, a pMOS transistor and an nMOS transistor in the semiconductor integrated circuit device. By controlling substrate bias voltages of the semiconductor integrated circuit device, e.g., by controlling a bias voltage $V_{PW}$ applied to a p-well formed in the substrate and a bias voltage $V_{NW}$ applied to an n-well formed in the substrate, the threshold voltages of these transistors can be varied. If these transistors are floating gate transistors, then the threshold voltage control means may vary the floating gate voltages of those transistors. If these transistors are multigate structure transistors, then the threshold voltage control means may vary the voltages of some gates of the plural gates of the transistors.

When the power supply voltage $V_{DD}$ of the semiconductor integrated circuit device is controlled, the voltage difference between the substrate voltage and the source voltage ($V_{DD}$) of the pMOS transistor is varied. The substrate voltage of the pMOS transistor is the bias voltage $V_{NW}$ applied to the n-well. The threshold value of the pMOS transistor can also be varied when the power supply voltage is controlled to vary the potential difference between the substrate voltage and the source voltage. Similarly, when the GND power supply voltage is controlled, the voltage difference between the substrate voltage and the source voltage (GND) of the nMOS transistor is varied. Here, the substrate voltage of the nMOS transistor is the bias voltage $V_{PW}$ applied to the p-well. The threshold value of the nMOS transistor can also be varied by controlling the GND power supply voltage.

According to the present invention, the threshold voltage is dynamically controlled to keep the ratio of the leakage current and the switching current constant, thereby making it possible to achieve a ratio for minimizing the operational power at all times depending on changes in operational environments including the temperature, the power supply voltage, the operating frequency, etc. According to the present invention, therefore, there is provided a semiconductor integrated circuit device which is capable of minimizing the operational power by keeping the ratio of the leakage current and the switching current constant.

As a result of dynamically controlling the threshold voltage as described above, it is possible to reduce adverse effects of process variations and changes in operational environments including the temperature, the power supply voltage, etc. According to the present invention, therefore, there is provided a semiconductor integrated circuit device which is capable of reducing effects of variations caused by the fabrication process, the temperature, the power supply voltage, etc. by keeping the ratio of the leakage current and the switching current constant.

According to the present invention, furthermore, the delay observation means and the power supply voltage control means are provided, and the power supply voltage control means is controlled preferentially with respect to the threshold voltage control means to supply a power supply voltage for maintaining, at all times, an operating condition in which a critical path delay is smaller than a necessary clock cycle. According to the present invention, therefore, there is provided a semiconductor integrated circuit device which is capable of keeping a speed performance required by a circuit.

BRIEF DESCRIPTION OF THE DRAWINGS

FIG. 54 is a truth table showing an operation sequence of the delay observer and the control switcher in the circuit shown in FIG. 53.

DESCRIPTION OF REFERENCE CHARACTERS

Figure 1:
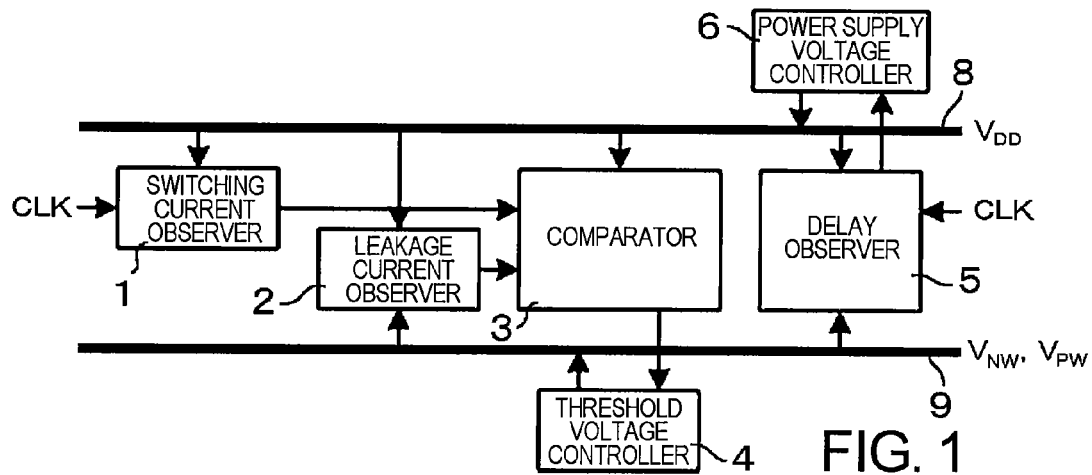
FIG. 1 is a block diagram showing an arrangement of a semiconductor integrated circuit device according to a first exemplary embodiment of the present invention.

1 Switching current observer
2 Leakage current observer
3, 61, 63, 631 to 636 Comparator
4 Threshold voltage controller
5 Delay observer
6 Power supply voltage controller
8 Power supply line
9 Substrate bias line
10 Control switcher
20 Selector switch
21 Precharging pMOS transistor
22 Capacitor (C)
23 Precharging nMOS transistor
24 Reference current generating circuit
25 Comparing circuit
26, 53 Register (REG)
27 Leakage current generating circuit
28 Reference current generating circuit
40 Threshold voltage compensator
41 Reference current source
42, 276 pMOS current mirror circuit
43, 275 nMOS current mirror circuit
44 pMOS switch
45 nMOS switch
46, 64 Control unit
47 Shift register unit
48 Counter unit
49 External setting signal
51 Critical path circuit
52 Delay circuit
54 Control circuit
63 Holding unit
241 to 243, 271, 273, 281 to 283 nMOS transistor
244 to 246, 272, 274, 284 to 286 pMOS transistor
277 Differential amplifier
611, 612 A/D (analog/digital) converter
613 Subtractor
621, 623, 625 Upper limit data holding unit
622, 624, 626 Lower limit data holding unit

BEST MODE FOR CARRYING OUT THE INVENTION

Preferred exemplary embodiments of the present invention will be described in detail below with reference to the drawings.

FIG. 1 shows an overall arrangement of a semiconductor integrated circuit device according to a first exemplary embodiment of the present invention. The semiconductor integrated circuit device includes power supply line 8 for being supplied with power supply voltage $V_{DD}$ and substrate bias line 9 for supplying substrate bias potentials $V_{PW}$, $V_{NW}$ into a semiconductor integrated circuit. Though not shown, the semiconductor integrated circuit device includes a circuit function part for realizing functions to be originally performed by the semiconductor integrated circuit device, as a CMOS logic circuit. Power supply line 8 supplies a power supply voltage to the circuit function part for operating the circuit function part. The circuit function part includes p-well regions and n-well regions formed in a semiconductor substrate, for example. Substrate bias line 9 applies a substrate bias voltage to these well regions. The circuit function part is also supplied with clock signal CLK as an operating clock. If the semiconductor integrated circuit device includes a plurality of circuit blocks each controlled for power consumption, then each of these circuit blocks corresponds to the circuit function part.

The semiconductor integrated circuit device also includes: switching current observer 1 for being supplied with power supply voltage $V_{DD}$ and clock signal CLK and observing a switching current in the semiconductor integrated circuit device; leakage current observer 2 for being supplied with power supply voltage $V_{DD}$ and substrate bias potentials $V_{PW}$, $V_{NW}$ and observing a leakage current in the semiconductor integrated circuit device; comparator (comparing circuit) 3 for comparing the switching current and the leakage current with each other; threshold voltage controller 4 for controlling the threshold voltage of each of MOS transistors of the semiconductor integrated circuit device to keep constant the ratio of the switching current and the leakage current; delay observer 5 for being supplied with power supply voltage $V_{DD}$ and substrate bias potentials $V_{PW}$, $V_{NW}$ and observing a delay amount in the semiconductor integrated circuit device; and power supply voltage controller 6 for controlling the power supply voltage used to operate the semiconductor integrated circuit device to keep the delay amount in a predetermined range. Threshold voltage controller 4 controls the threshold voltage by varying the potential of substrate bias line 9. Power supply voltage controller 6 varies power supply voltage $V_{DD}$ supplied to power supply line 8. Comparator 3 is also supplied with power supply voltage $V_{DD}$ for use as a reference for the comparing operation of comparator 3.

Each of switching current observer 1, leakage current observer 2, and delay observer 5 has circuit elements that are identical in construction to those used in the circuit function part, and is fabricated simultaneously with the circuit function part in the semiconductor integrated circuit device by the same fabrication process as with the circuit function part. Therefore, though switching current observer 1 does not measure an actual switching current in the circuit function part, it can observe a switching current which is substantially the same as the switching current in the circuit function part. Similarly, leakage current observer 2 observes a leakage current which is substantially the same as a leakage current in the circuit function part, and delay observer 5 observes a delay amount which is substantially the same as a signal delay amount in the circuit function part. When power supply voltage $V_{DD}$ at power supply line 8 or substrate bias potentials $V_{PW}$, $V_{NW}$ at substrate bias line 9 vary or the frequency of clock signal CLK varies, the switching current, the leakage current, and the delay amount in the circuit function part also vary. The switching current observed by switching current observer 1, the leakage current observed by leakage current observer 2, and the delay observed by delay observer 5 also vary in response to these changes at the circuit function part.

In the semiconductor integrated circuit device, comparator 3 performs comparison to ascertain whether the ratio of the results observed by switching current observer 1 and leakage current observer 2 is of a predetermined value or not, and threshold voltage controller 4 controls the threshold voltage (i.e., the substrate bias potentials) to cause the switching current and the leakage current to have a constant ratio. Delay observer 5 performs observation to ascertain whether a critical path delay falls in an operating clock period or not. Depending on the observed result, power supply voltage observer 6 controls power supply voltage $V_{DD}$ of power supply line 8 such that the critical path delay is smaller than the operating clock period and power supply voltage $V_{DD}$ is as low as possible.

Figure 2:
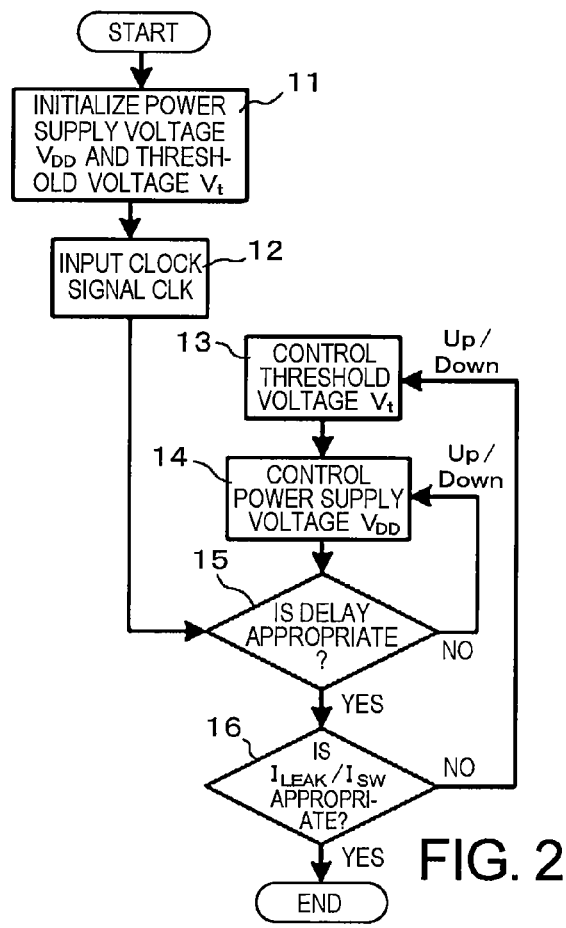
FIG. 2 is a flowchart showing an operation sequence of the semiconductor integrated circuit device according to the first exemplary embodiment.

Operation of the semiconductor integrated circuit device will be described below with reference to a flowchart shown in FIG. 2. FIG. 2 shows a sequence for controlling power supply voltage $V_{DD}$ and threshold voltage $V_t$ depending on the operation clock.

In Step 11, power supply voltage $V_{DD}$ and threshold voltage $V_t$ are set to initial values. The initial values may be standard values, or values for guaranteeing normal operation, or a maximum power supply voltage and a minimum threshold voltage, respectively. In Step 12, clock signal CLK is supplied to delay observer 5. In Step 15, delay observer 5 determines whether the delay amount is appropriate or not, i.e., whether the critical path delay is smaller than the clock period or not. If the critical path delay is smaller than the clock period, then the circuit to be controlled is in an operable state and can start to operate.

If the delay amount is not appropriate in Step 15, then control goes to Step 14 in which power supply voltage controller 6 controls power supply voltage $V_{DD}$ to equalize the critical path delay to a lower limit smaller than the clock period with respect to the transistor of the threshold voltage at the time. Then, control goes back to Step 15. On the contrary, if the delay amount is appropriate in Step 15, then comparator 3 determines in Step 16 whether ratio $I_{LEAK}/I_{SW}$ of leakage current $I_{LEAK}$ and switching current $I_{SW}$ is a predetermined ratio, i.e., a target value, with respect to the operating frequency and the power supply voltage. If ratio $I_{LEAK}/I_{SW}$ is the predetermined ratio, then the sequence is put to an end. Otherwise, control goes to Step 13 in which threshold voltage controller 4 controls threshold voltage $V_{th}$ to equalize the ratio of the leakage current and the switching current to the target value at this time. If ratio $I_{LEAK}/I_{SW}$ is of a constant value determined by the operating frequency and the power supply voltage at the time, then the semiconductor integrated circuit device is now in a state capable of operating with lower electric power. After Step 13 is executed, control goes to Step 14.

A synchronous circuit has an essential requirement for rate guarantee, and needs to satisfy the condition that a critical path delay is smaller than a clock period under threshold voltage control. Therefore, after Step 13 is executed, control goes to Step 14. If the operating clock frequency varies, particularly if the frequency becomes higher, then it is preferable to shut down the circuit to be controlled, and to resume its operation after it is confirmed that the critical path delay is smaller than the clock period and the semiconductor integrated circuit device is in the operable state.

In the present exemplary embodiment, if a transistor of the semiconductor integrated circuit device is a floating gate transistor, then threshold voltage controller 4 may vary the threshold value by varying the floating gate voltage of the floating gate transistor. If a transistor of the semiconductor integrated circuit device is a multigate structure transistor, then threshold voltage controller 4 may vary the threshold value by varying the voltage of one or some of the gates of the transistor.

Figure 3:
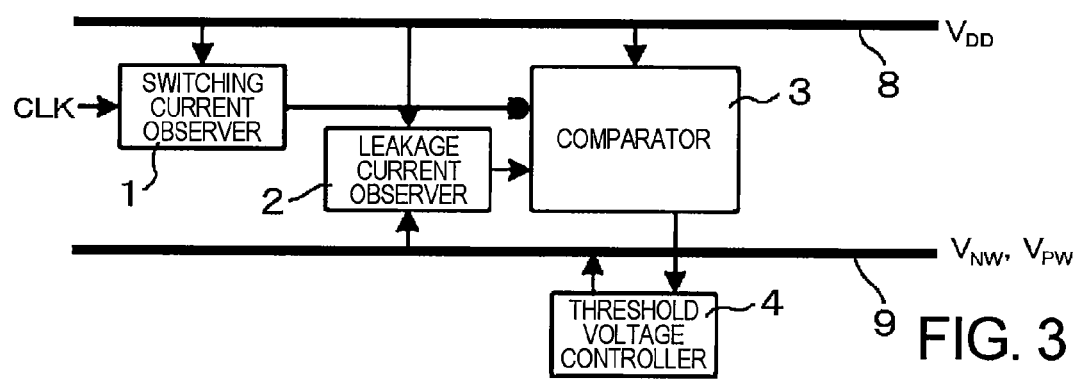
FIG. 3 is a block diagram showing an arrangement of a semiconductor integrated circuit device according to a second exemplary embodiment of the present invention.

A second exemplary embodiment of the present invention will be described below. FIG. 3 shows an overall arrangement of a semiconductor integrated circuit device according to the second exemplary embodiment. The semiconductor integrated circuit device shown in FIG. 3 is of an arrangement formed by removing delay observer 5 and power supply voltage controller 6 from the semiconductor integrated circuit device shown in FIG. 1. The semiconductor integrated circuit device is given power supply voltage $V_{DD}$ together with clock signal CLK (frequency f). Based on the results observed by switching current observer 1 and leakage current observer 2, comparator 3 compares them to ascertain whether the ratio of the switching current and the leakage current is of a predetermined value or not, and threshold voltage controller 4 controls the threshold voltage such that the ratio of the leakage current and the switching current is the predetermined value.

Figure 4:
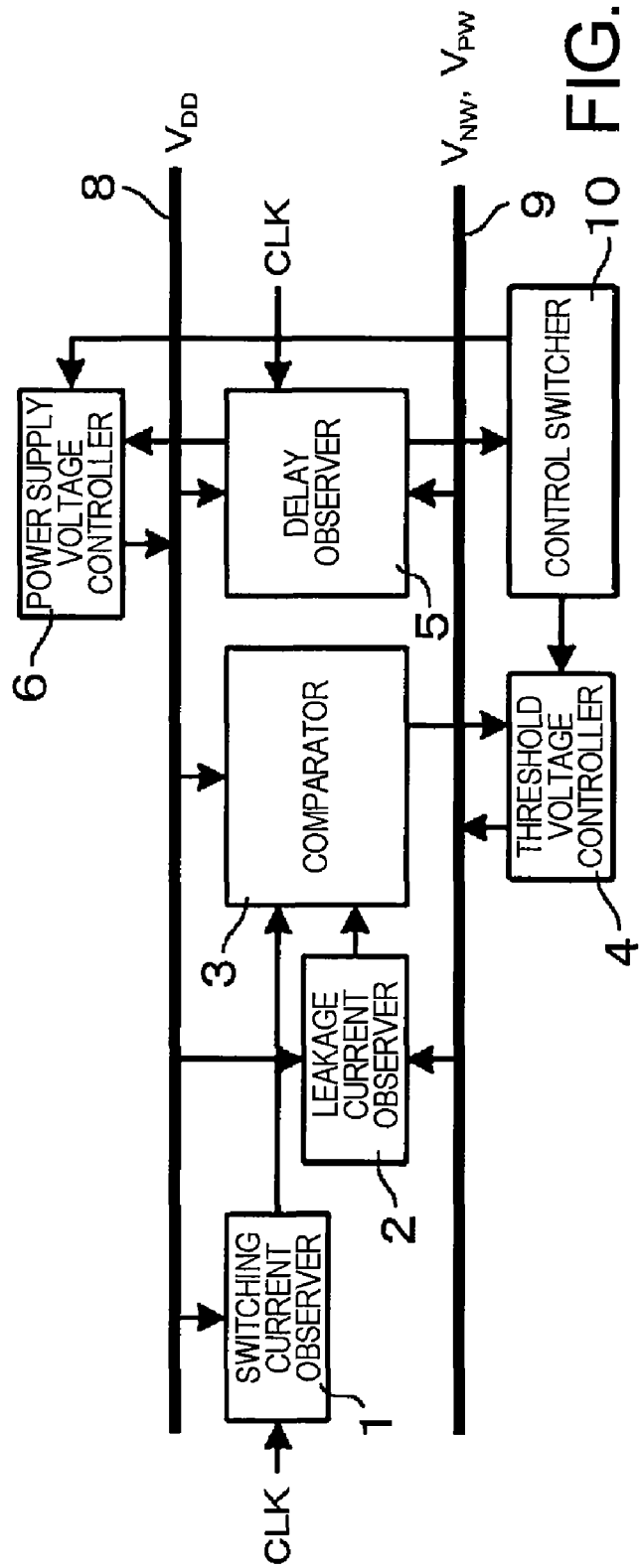
FIG. 4 is a block diagram showing an arrangement of a semiconductor integrated circuit device according to a third exemplary embodiment of the present invention.

A third exemplary embodiment of the present invention will be described below. FIG. 4 shows an overall arrangement of a semiconductor integrated circuit device according to the third exemplary embodiment. In the semiconductor integrated circuit device according to the first exemplary embodiment shown in FIG. 1, threshold voltage controller 4 and power supply voltage controller 6 can independently control the operation. The semiconductor integrated circuit device according to the third exemplary embodiment includes control switcher 10 which performs switching operation to prioritize one of the power supply voltage control and the threshold voltage control. It is assumed that the threshold voltage control is performed only if the operating speed satisfies a certain rate performance, i.e., if the operating speed satisfies $t_{D1} < T_{clk} < t_{D2}$. If the operating speed fails to satisfy the rate performance, i.e., if $T_{clk} < t_{D0}$ or $t_{D3} < T_{clk}$, because the threshold voltage control has been carried out or because of a temperature change, then the power supply voltage control is carried out. Since control switcher 10 switches exclusively between the power supply voltage control and the threshold voltage control, the control system maintains its stability. Here, the clock period is represented by $T_{clk}$, the critical path delay by $t_{D-1}$, a margin D0 added delay by $t_{D0}$, a margin D1 added delay by $t_{D1}$, a margin D2 added delay by $t_{D2}$, and a margin D3 added delay by $t_{D3}$.

Figure 5:
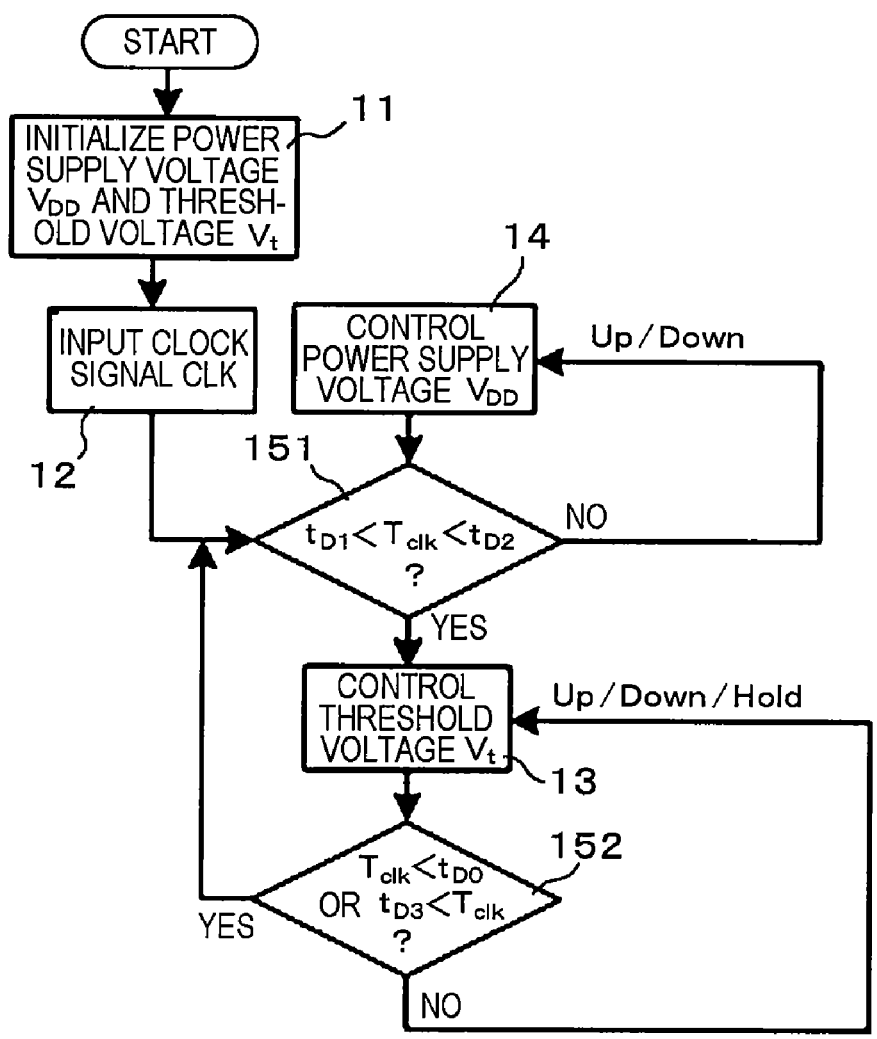
FIG. 5 is a flowchart showing an operation sequence of the semiconductor integrated circuit device according to the third exemplary embodiment.

FIG. 5 is a flowchart showing an operation sequence of the semiconductor integrated circuit device shown in FIG. 4. After Steps 11, 12 are executed in the same manner as shown in FIG. 2, it is determined whether $t_{D1} < T_{clk} < t_{D2}$ is satisfied or not in Step 151. If it is satisfied, the threshold voltage control is carried out in Step 13. Then, it is determined whether a deviation occurs from the rate performance in Step 152. If $T_{clk} < t_{D0}$ or $t_{D3} < T_{clk}$, then it is judged that a deviation occurs from the rate performance. If a deviation occurs from the rate performance, then control goes back to Step 151. If no deviation occurs, then control may go back to Step 13. If $t_{D1} < T_{clk} < t_{D2}$ is not satisfied in Step 151, then the power supply voltage control is carried out in Step 14, after which Step 151 is executed again.

Figure 6:
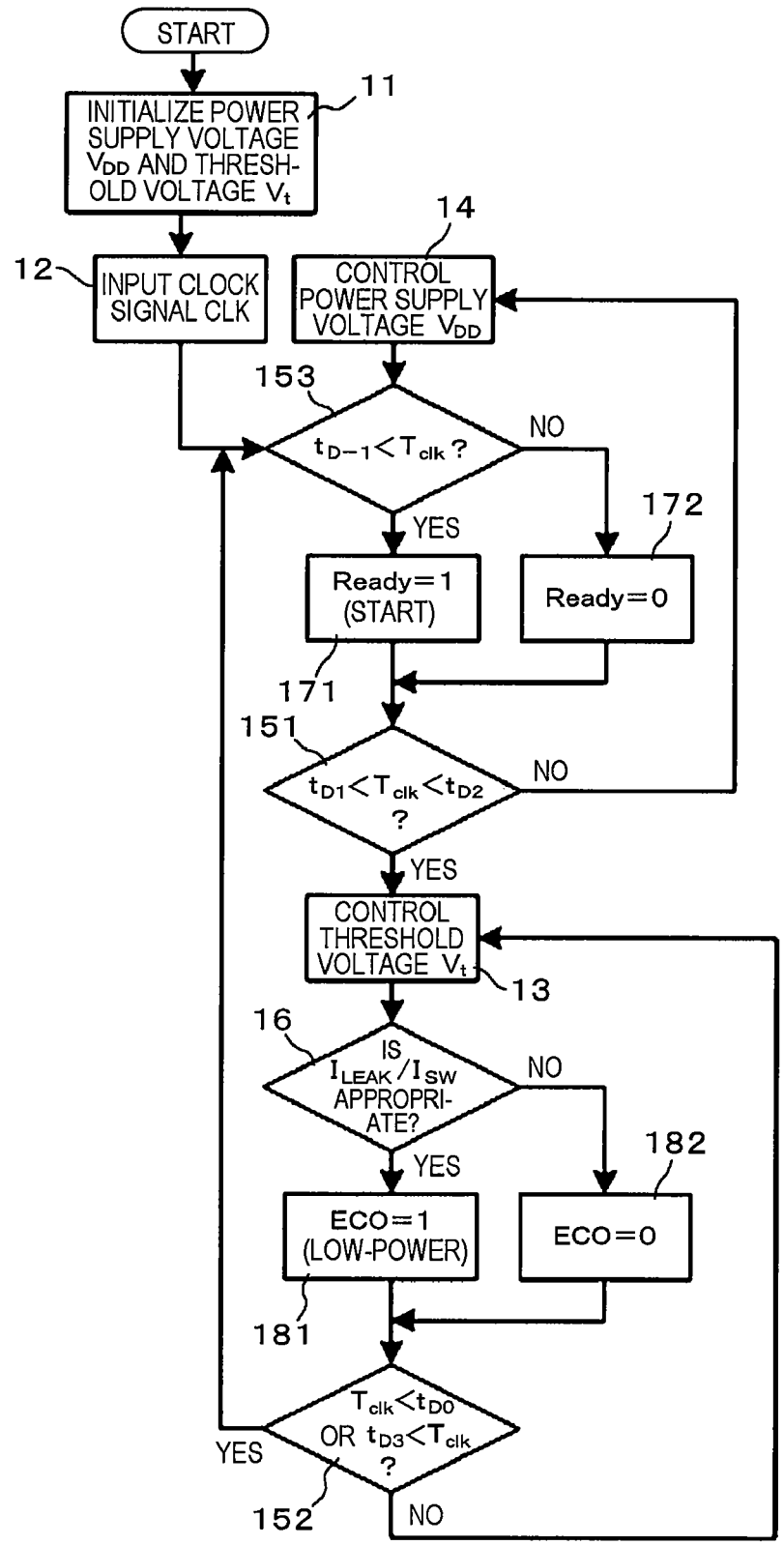
FIG. 6 is a flowchart showing another operation sequence of the semiconductor integrated circuit device according to the third exemplary embodiment.

In the third exemplary embodiment, control switcher 10 may output operability signal Ready under the condition that the critical path delay is smaller than the clock period ($t_{D-1} < T_{clk}$). If ratio $I_{LEAK}/I_{SW}$ of switching current ($I_{SW}$) and leakage current ($I_{LEAK}$) is appropriate, then control switcher 10 may output high-power-efficiency signal ECO. FIG. 6 is a flowchart showing an operation sequence for such a case. According to the operation sequence shown in FIG. 6, Step 153 for determining whether $t_{D-1} < T_{clk}$ is satisfied or not is added before Step 151 of the operation sequence shown in FIG. 5. If $t_{D-1} < T_{clk}$ is satisfied, then Ready=1 in Step 171, and thereafter Step 151 is executed. If $t_{D-1} < T_{clk}$ is not satisfied, then Ready=0 in Step 172, and thereafter Step 151 is executed. Step 16 for determining whether ratio $I_{LEAK}/I_{SW}$ is of an appropriate value or not is added before Step 152. If ratio $I_{LEAK}/I_{SW}$ is of an appropriate value, then ECO=1 in Step 181, and thereafter Step 152 is executed. If ratio $I_{LEAK}/I_{SW}$ is not of an appropriate value, then ECO=0 in Step 182, and thereafter Step 152 is executed.

Figure 7:
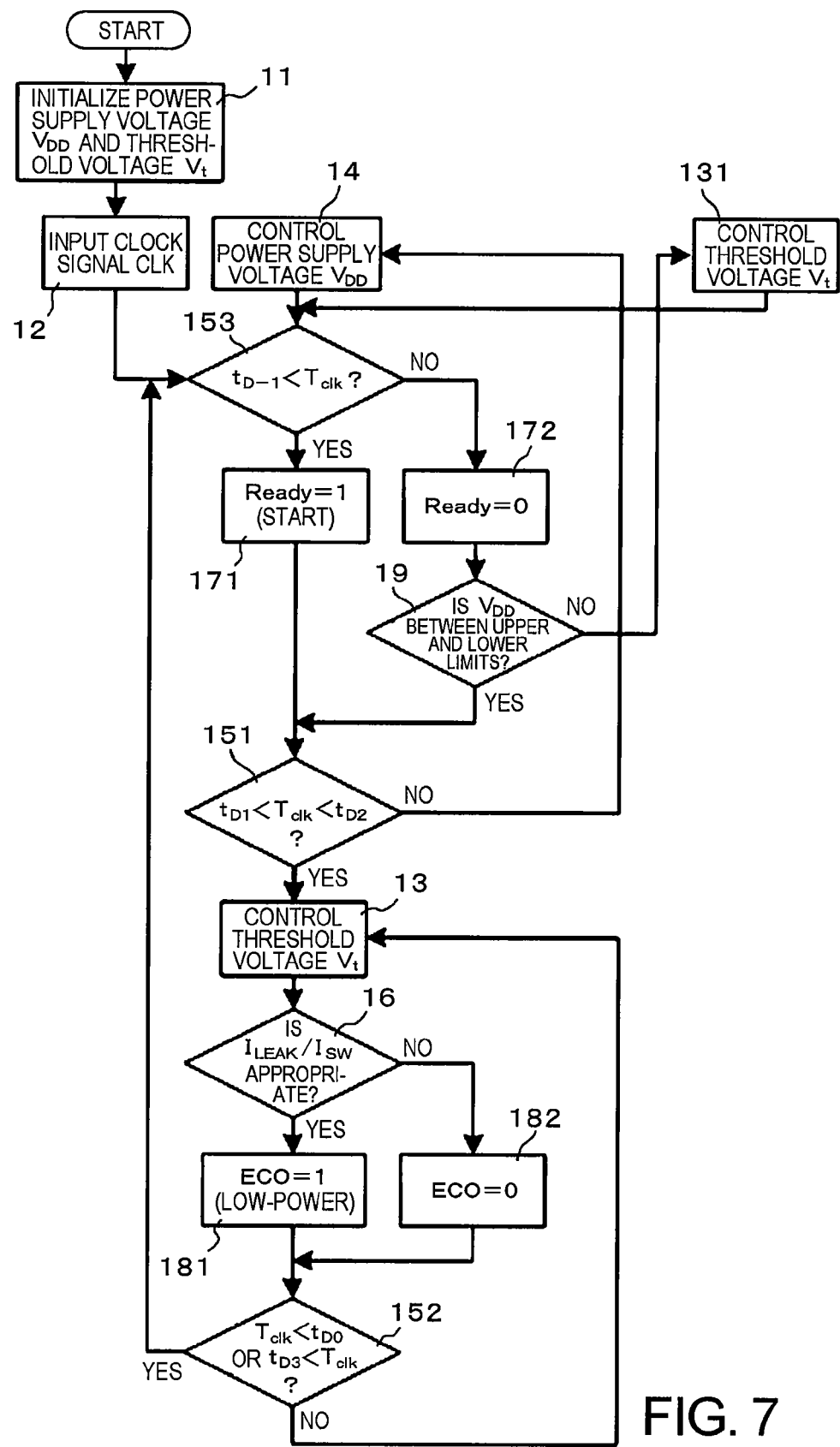
FIG. 7 is a flowchart showing still another operation sequence of the semiconductor integrated circuit device according to the third exemplary embodiment.

If the power supply voltage reaches a control limit (an upper limit or a lower limit) in the power supply control, then in case rate priority is given, the power supply control may switch to the threshold voltage control to realize the necessary rate performance. FIG. 7 is a flowchart showing an operation sequence for performing such control. The operation sequence shown in FIG. 7 includes Step 19 for determining whether power supply voltage $V_{DD}$ is between predetermined upper and lower limits or not, Step 19 being added after Step 172 and before Step 151 in the operation sequence shown in FIG. 6. If the power supply voltage is in the range between the upper and lower limits in Step 19, control goes to Step 151. Otherwise, the threshold voltage control is carried out in Step 131, after which control returns to Step 153.

In the third exemplary embodiment, the above control process may be dispensed with, and the control switcher may simply switch alternately between the power supply voltage control and the threshold voltage control.

Figure 8:
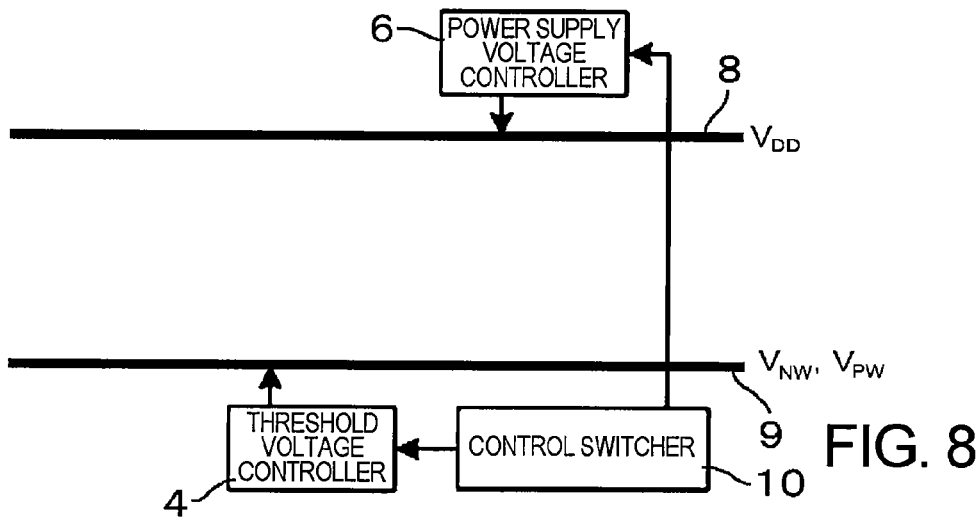
FIG. 8 is a block diagram showing an arrangement of a semiconductor integrated circuit device according to a fourth exemplary embodiment of the present invention.

A fourth exemplary embodiment of the present invention will be described below. FIG. 8 shows an overall arrangement of a semiconductor integrated circuit device according to the fourth exemplary embodiment. The semiconductor integrated circuit device shown in FIG. 8 is of an arrangement formed by removing switching current observer 1, leakage current observer 2, comparator 3, and delay observer 5 from the semiconductor integrated circuit device shown in FIG. 4, and comprises threshold voltage controller 4, power supply voltage controller 6, and control switcher 10 as major components. In this semiconductor integrated circuit device, control switcher 10 switches exclusively between the threshold voltage control and the power supply voltage control to guarantee the stability of the control system.

Structural details of the semiconductor integrated circuit devices according to the above exemplary embodiments will be described below.

Figure 9:
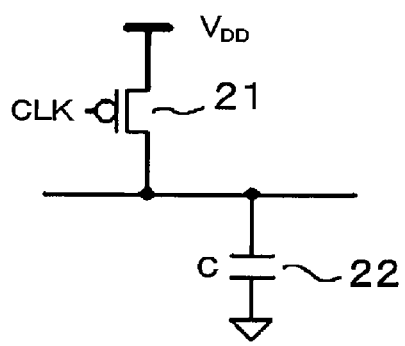
FIG. 9 is a circuit diagram showing an example of a switching current observer.
Figure 10:
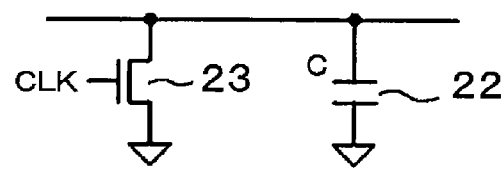
FIG. 10 is a circuit diagram showing another example of the switching current observer.

FIG. 9 shows an example of an arrangement of switching current observer 1. Switching current observer 1 includes precharging pMOS transistor 21 and capacitor (C) 22 that are connected in series to each other with respect to power supply voltage $V_{DD}$. The period of a half cycle of clock signal CLK is used as an evaluation period after capacitor C is precharged or predischarged. For detecting whether the potential of capacitor C is $V_{DD}/2$ or not in the evaluation period after capacitor C is precharged, the circuit is equivalent to a current source of $C \times V_{DD} \times f$, which is regarded as representing switching current $I_{SW}$, where f indicates the frequency of clock signal CLK (clock frequency). For detecting whether the potential of capacitor C is $V_{DD}/2$ or not in the evaluation period after capacitor C is predischarged, the switching current observer may be of an arrangement including precharging nMOS transistor 23 and capacitor (C) 22 that are connected parallel to each other, as shown in FIG. 10.

Figure 11:
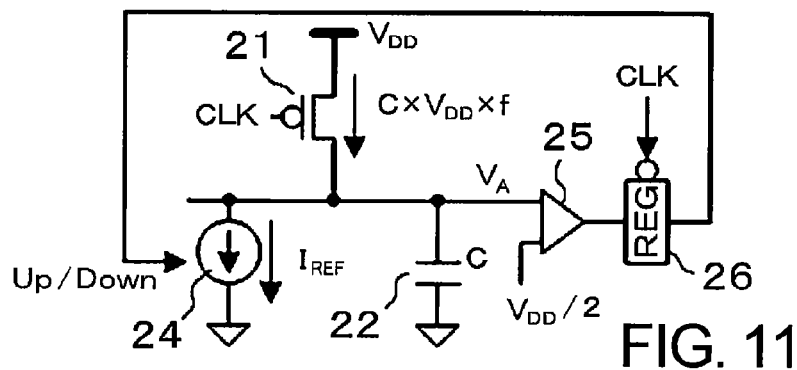
FIG. 11 is a circuit diagram showing still another example of the switching current observer.

As still another example, switching current observer comprises precharging pMOS transistor 21, capacitor (C) 22, reference current generating circuit 24 for generating reference current $I_{REF}$, comparing circuit 25, and register (REG) 26, as shown in FIG. 11. In this circuit, pMOS transistor 21 and capacitor 22 are connected in series to each other between power supply voltage $V_{DD}$ and the ground potential, and reference current generating circuit 24 is connected parallel to capacitor C. Comparing circuit 25 compares voltage $V_A$ at a junction (comparison node) between pMOS transistor 21 and capacitor 22 with a one-half value of power supply voltage $V_{DD}$, i.e., $V_{DD}/2$. The comparison result is read into register 26 in synchronism with clock signal CLK. The value of reference current $I_{REF}$ increases or decreases depending on the comparison result.

Figure 12:
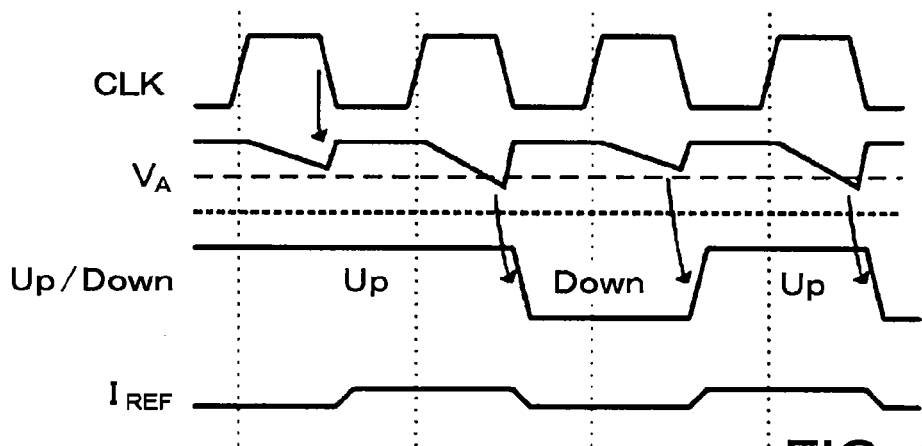
FIG. 12 is a timing chart showing an operation sequence of the switching current observer shown in FIG. 11.

FIG. 12 is a timing chart showing an operation sequence of the circuit shown in FIG. 11.

Periods in which clock signal CLK is low are precharging periods during which comparison node voltage $V_A$ changes to power supply voltage $V_{DD}$. During evaluation periods after the precharging periods, comparison node voltage $V_A$ drops depending on capacitor C and reference current $I_{REF}$. Comparing circuit 25 compares $V_A$ and $V_{DD}/2$ with each other for their magnitude. After T/2, i.e., at a negative-going edge of clock signal CLK, register 26 latches the comparison result. T represents the time of one periodic cycle of clock signal CLK. If the register data is high, an Up/Down signal goes Up, increasing reference current $I_{REF}$. If the register data is low, an Up/Down signal goes Down, decreasing reference current $I_{REF}$. The signal flows through the feedback loop each time a clock pulse is applied. However, if the response of the circuit, particularly the response of reference current generating circuit 24, is slow, then it is necessary to decimate the reading of the Up/Down control signal in order to keep the circuit stable in operation.

Figure 13:
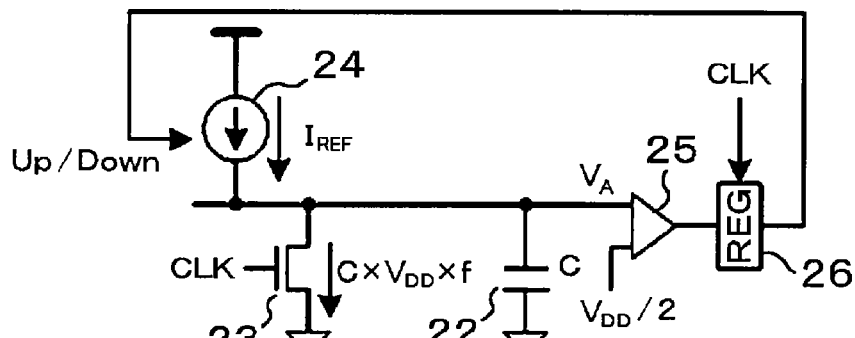
FIG. 13 is a circuit diagram showing yet another example of the switching current observer.
Figure 14:
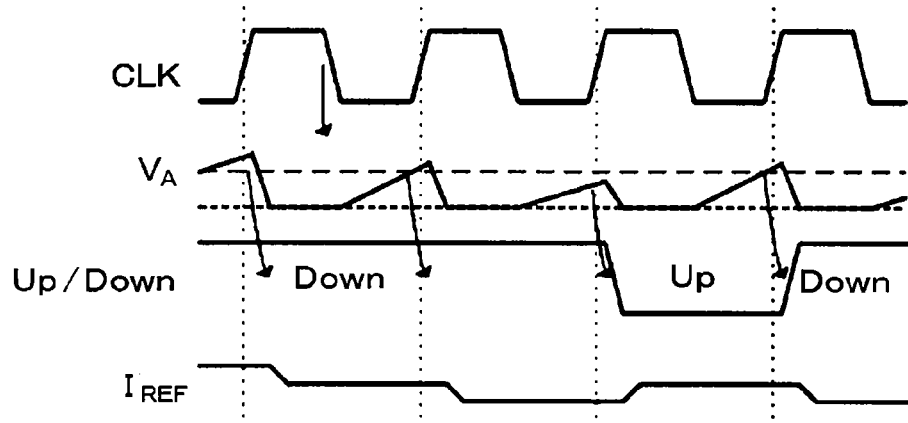
FIG. 14 is a timing chart showing an operation sequence of the switching current observer shown in FIG. 13.

Similarly, as shown in FIG. 13, switching current observer may comprise capacitor (C) 22, predischarging nMOS transistor 23 connected parallel to capacitor (C), reference current generating circuit 24 for generating reference current $I_{REF}$, comparing circuit 25, and register 26. Reference current $I_{REF}$ generated by reference current generating circuit 24 is supplied to the parallel-connected assembly of capacitor (C) 22 and nMOS transistor 23. FIG. 14 is a timing chart showing an operation sequence of the circuit shown in FIG. 13. Periods in which clock signal CLK is high are predischarging periods during which comparison node voltage $V_A$ changes to ground potential GND. During evaluation periods after the predischarging periods, comparison node voltage $V_A$ rises depending on capacitor C and reference current $I_{REF}$. Comparing circuit 25 compares $V_A$ and $V_{DD}/2$ with each other for their magnitude. After T/2, i.e., at a positive-going edge of clock signal CLK, register 26 latches the comparison result. If the register data is high, an Up/Down signal goes Down, decreasing reference current $I_{REF}$. If the register data is low, an Up/Down signal goes Up, increasing reference current $I_{REF}$. As with the case shown in FIG. 12, if the response of the circuit, particularly the response of reference current generating circuit 24, is slow, then it is necessary to decimate the reading of the Up/Down control signal in order to keep the circuit stable in operation.

Figure 15:
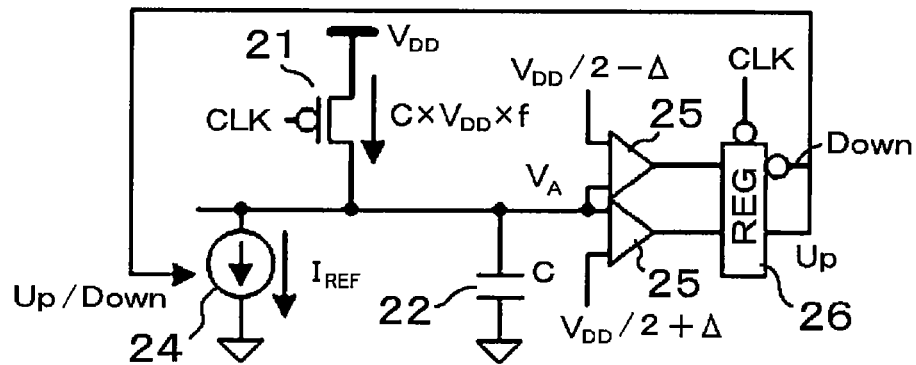
FIG. 15 is a circuit diagram showing yet still another example of the switching current observer.

FIG. 15 shows yet still another example of the arrangement of the switching current observer. The circuit shown in FIG. 15 includes two comparing circuits 25 in the circuit shown in FIG. 11. One of the comparing circuits compares reference voltage $V_{DD}/2+\Delta$ with $V_A$ and generates an Up signal. The other comparing circuit compares reference voltage $V_{DD}/2-\Delta$ with $V_A$ and generates a Down signal.

Figure 16:
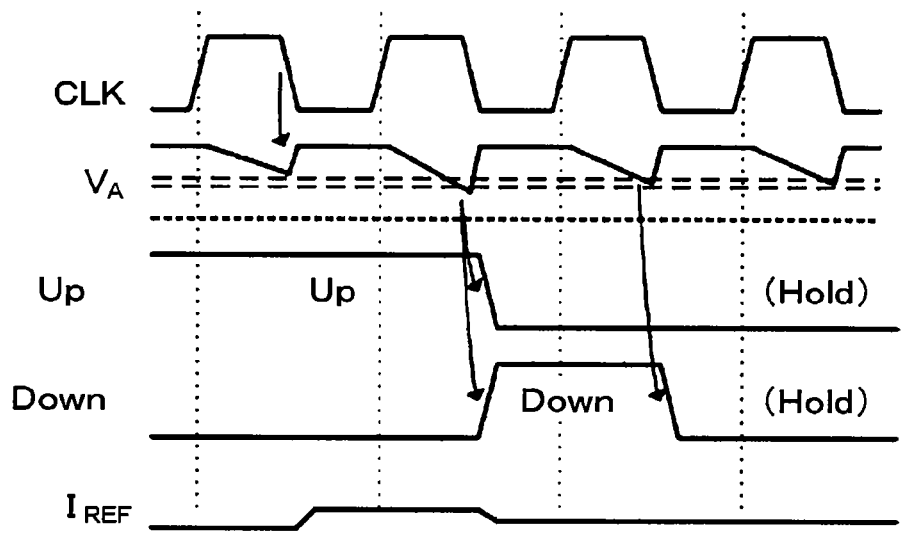
FIG. 16 is a timing chart showing an operation sequence of the switching current observer shown in FIG. 15.

FIG. 16 is a timing chart showing an operation sequence of the circuit shown in FIG. 15. In the circuit shown in FIG. 15, Up and Down signals are separately generated to provide a hold state. If $V_A$ is between $V_{DD}/2+\Delta$ and $V_{DD}/2-\Delta$ at a negative-going edge of clock signal CLK, then the circuit is in the hold state.

Figure 17:
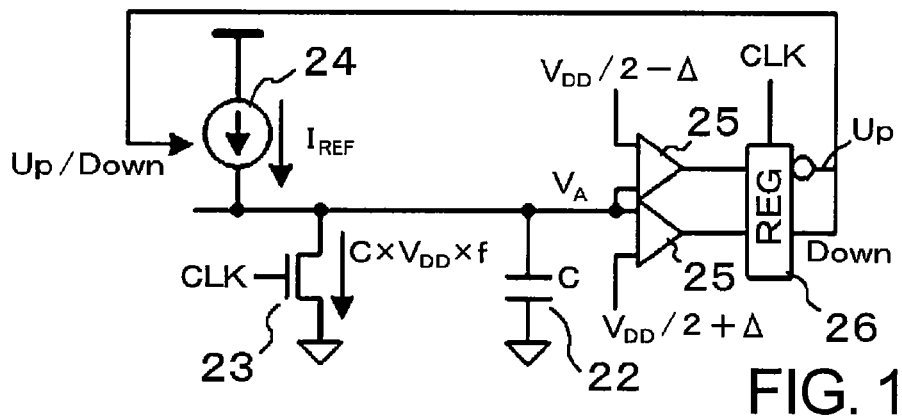
FIG. 17 is a circuit diagram showing a further example of the switching current observer.
Figure 18:
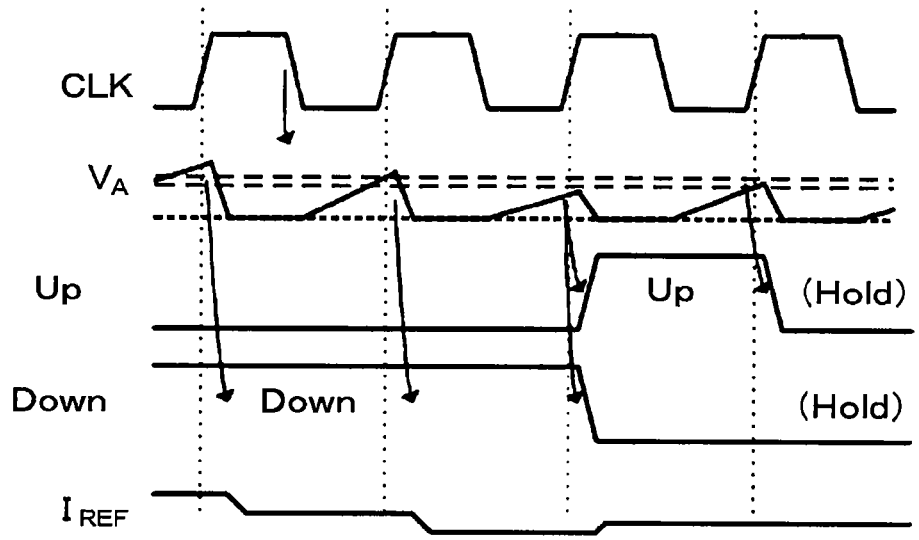
FIG. 18 is a timing chart showing an operation sequence of the switching current observer shown in FIG. 17.

Likewise, as shown in FIG. 17, the arrangement shown in FIG. 13 may include two comparing circuits 25. FIG. 18 is a timing chart showing an operation sequence of the circuit shown in FIG. 17. In this circuit, Up and Down signals are also separately generated. If $V_A$ is between $V_{DD}/2+\Delta$ and $V_{DD}/2-\Delta$ at a positive-going edge of clock signal CLK, then the circuit is in the hold state.

Figure 19:
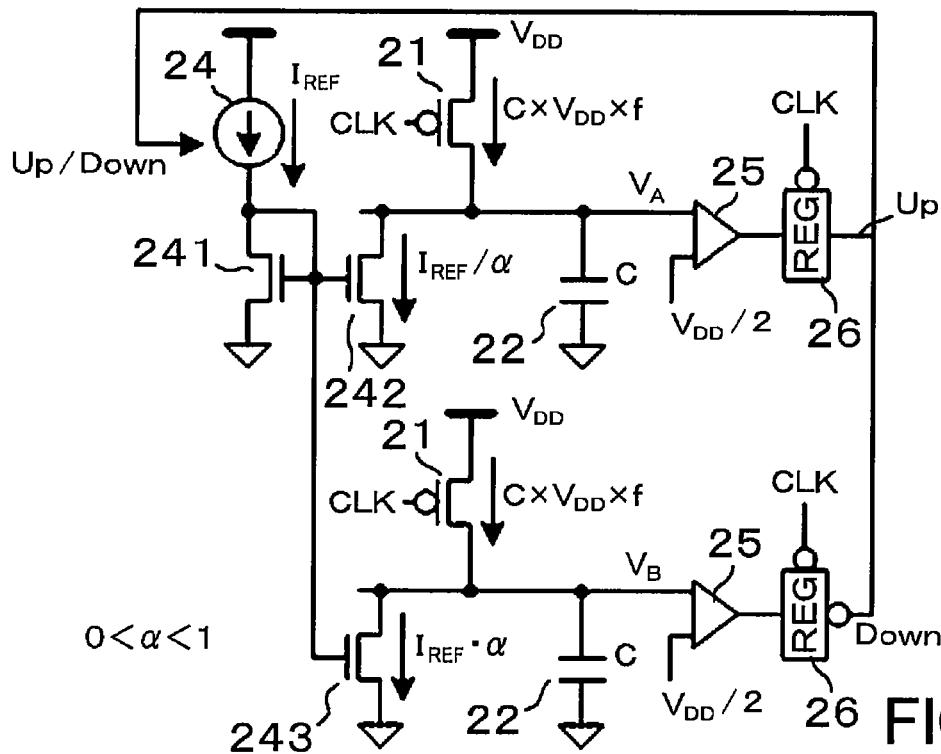
FIG. 19 is a circuit diagram showing a still further example of the switching current observer.

FIG. 19 shows a still further example of the arrangement of the switching current observer. The circuit shown in FIG. 19 comprises two sets of circuits each shown in FIG. 11, providing a current mirror circuit. One of the circuits uses reference current $I_{REF}/\alpha$ to generate an Up signal, and the other circuit uses reference current $I_{REF}\cdot\alpha$ to generate a Down signal. The comparison node voltage in one of the circuits is represented by $V_A$, whereas the comparison node voltage in the other circuit by $V_B$. Here, nMOS transistors 241 to 243 make up a current mirror. Reference current $I_{REF}$ generated by reference current generating circuit 24 flows through nMOS transistor 241, causing nMOS transistor 242 of one of the circuits to generate reference current $I_{REF}/\alpha$, and causing nMOS transistor 243 of the other circuit to generate reference current $I_{REF}\cdot\alpha$.

Figure 20:
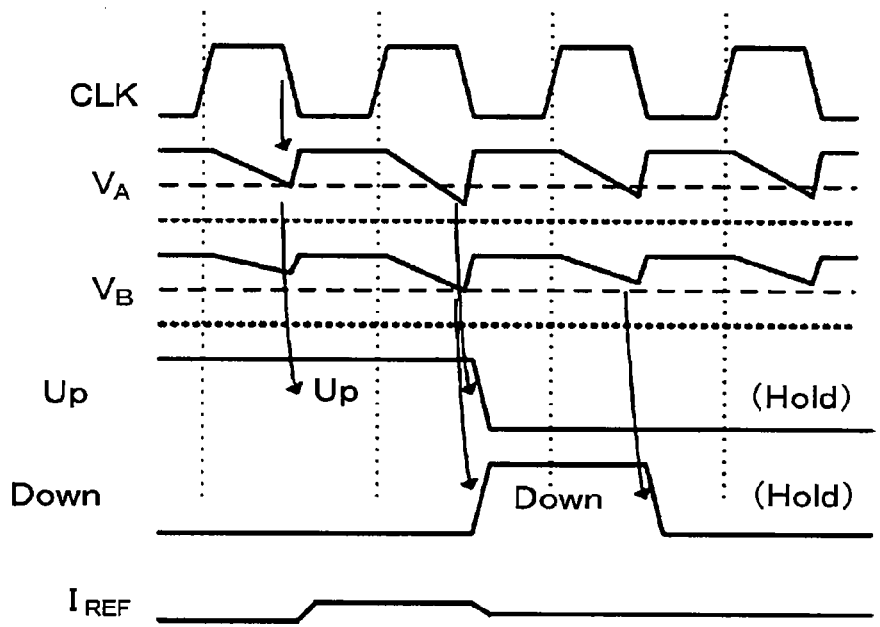
FIG. 20 is a timing chart showing an operation sequence of the switching current observer shown in FIG. 19.

FIG. 20 is a timing chart showing an operation sequence of the circuit shown in FIG. 19. In the circuit shown in FIG. 19, Up and Down signals are also separately generated to provide a hold state.

Figure 21:
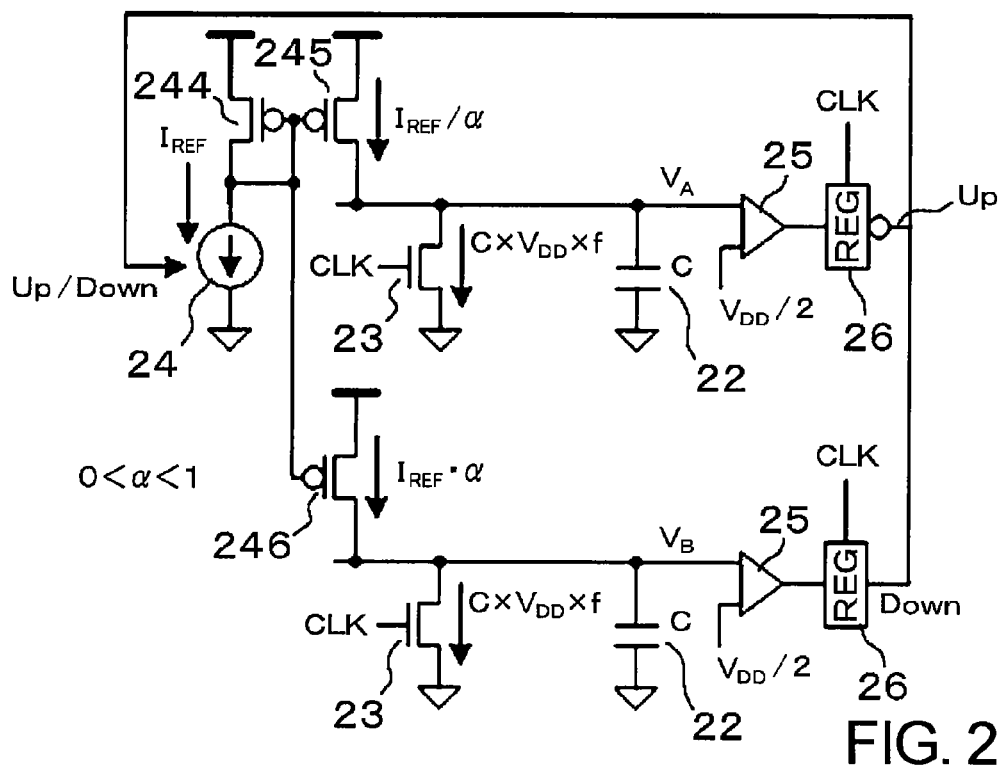
FIG. 21 is a circuit diagram showing a yet still further example of the switching current observer.
Figure 22:
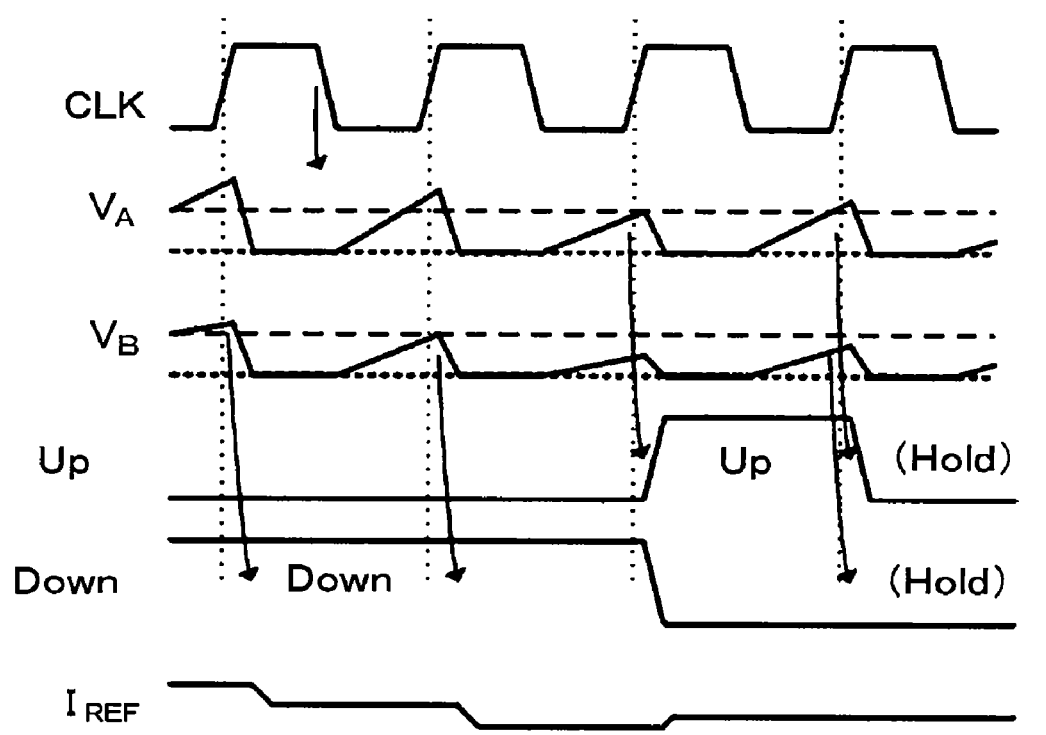
FIG. 22 is a timing chart showing an operation sequence of the switching current observer shown in FIG. 21.

Similarly, an arrangement shown in FIG. 21 includes two sets of circuits each shown in FIG. 13, providing a current mirror circuit wherein one of the circuits uses reference current $I_{REF}/\alpha$ to generate an Up signal, and the other circuit uses reference current $I_{REF}\cdot\alpha$ to generate a Down signal. Here, pMOS transistors 244 to 246 make up a current mirror. FIG. 22 is a timing chart showing an operation sequence of the circuit shown in FIG. 21. In the circuit shown in FIG. 21, Up and Down signals are also separately generated to provide a hold state.

Exemplary arrangements of reference current generating circuit 24 used in the above switching current observers will be described below.

Figure 23:
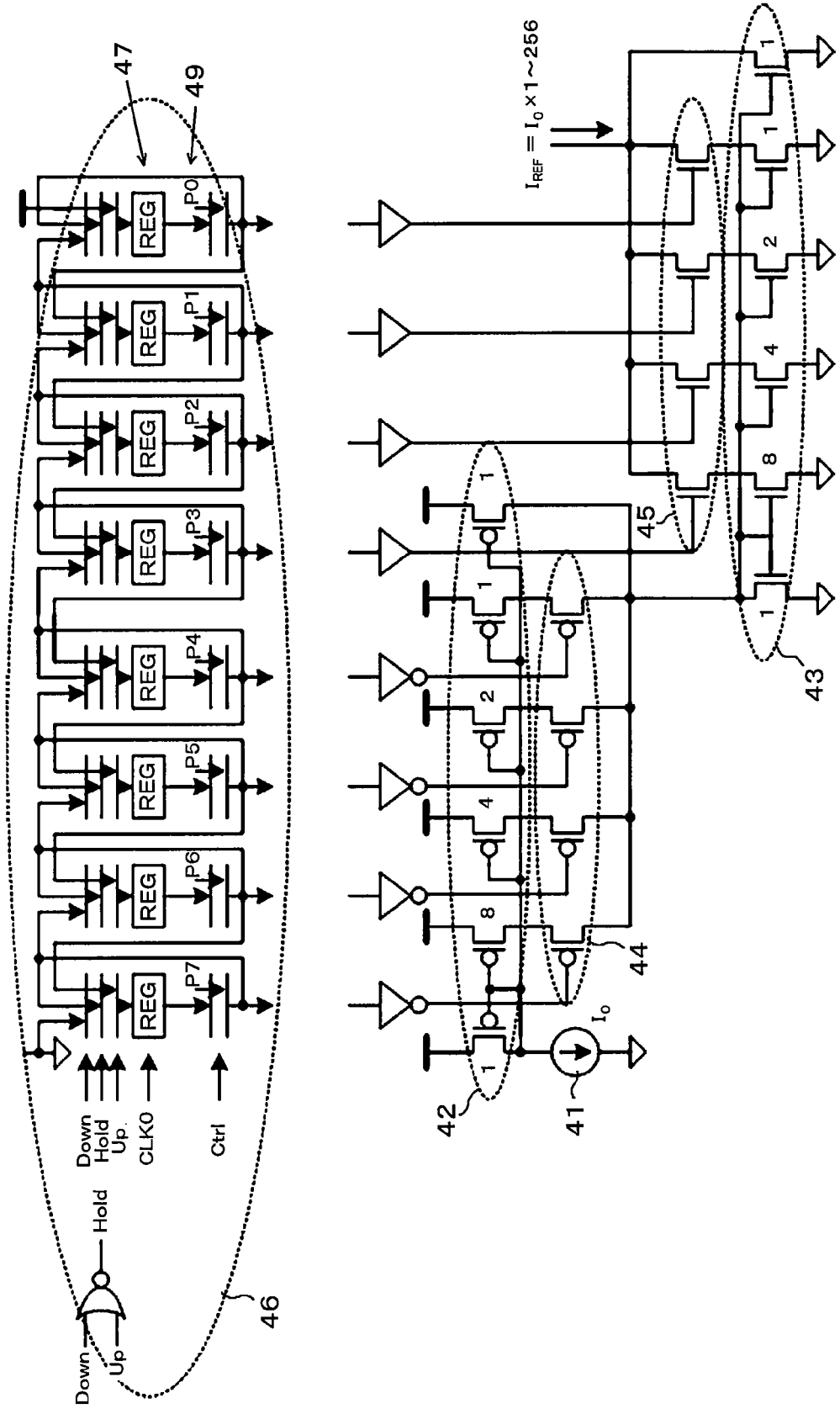
FIG. 23 is a circuit diagram showing an example of a reference current generator.

As shown in FIG. 23, reference current generating circuit 24 comprises reference current source 41, current mirror arrays 42, 43, current switch arrays 44, 45, and control logic circuit 46. The total current can be controlled by controlling the turn-on and turn-off of current switch arrays 44, 45. A current value can be set by external setting signals 49. Control logic circuit 46 includes shift registers 47 for shifting up 1 or shifting down 0 depending on the Up/Down signal to increase or decrease the reference current value.

Figure 24:
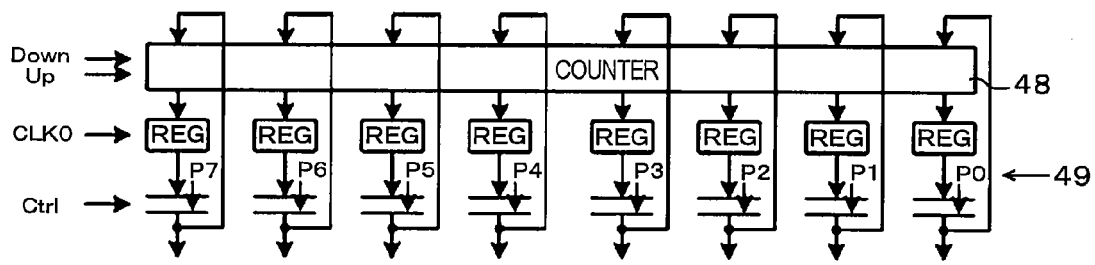
FIG. 24 is a circuit diagram showing another example of the control logic circuit in the reference current generator.

Similarly, as shown in FIG. 24, control logic circuit 46 may be of an arrangement including counter 48. Clock signal CLK0 for controlling the registers is either identical to clock signal CLK of switching current observer 1 or a clock signal having a frequency lower than clock signal CLK, and is determined to satisfy the stability of the feedback loop.

Figure 25:
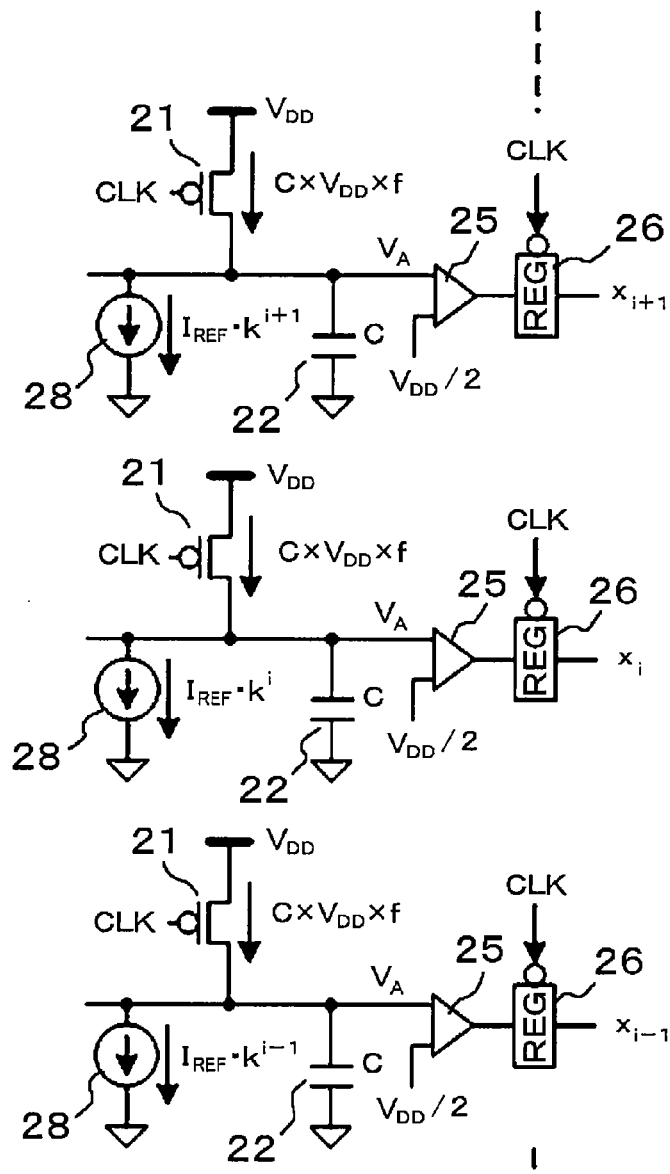
FIG. 25 is a circuit diagram showing another example of the switching current observer.

Further, another example of the arrangement of switching current observer 1 will be described below. FIG. 25 shows a switching current observer comprising a plurality of unit circuits each including precharging pMOS transistor 21, capacitor (C) 22, reference current generating circuit 28 for generating a reference current, comparing circuit 25, and register 26. In each of the unit circuits, pMOS transistor 21 and capacitor 22 are connected in series to each other between power supply voltage $V_{DD}$ and the ground potential, and reference current generating circuit 28 is connected parallel to capacitor C. Comparing circuit 25 compares voltage $V_A$ at a junction (comparison node) between pMOS transistor 21 and capacitor 22 with a one-half value of power supply voltage $V_{DD}$, i.e., $V_{DD}/2$. The comparison result is read into register 26 in synchronism with clock signal CLK. The reference current value generated by reference current generating circuit 28 differs from unit circuit to unit circuit. Reference currents provided at a plurality of levels allow a bit string to be generated depending on the switching current.

Figure 26:
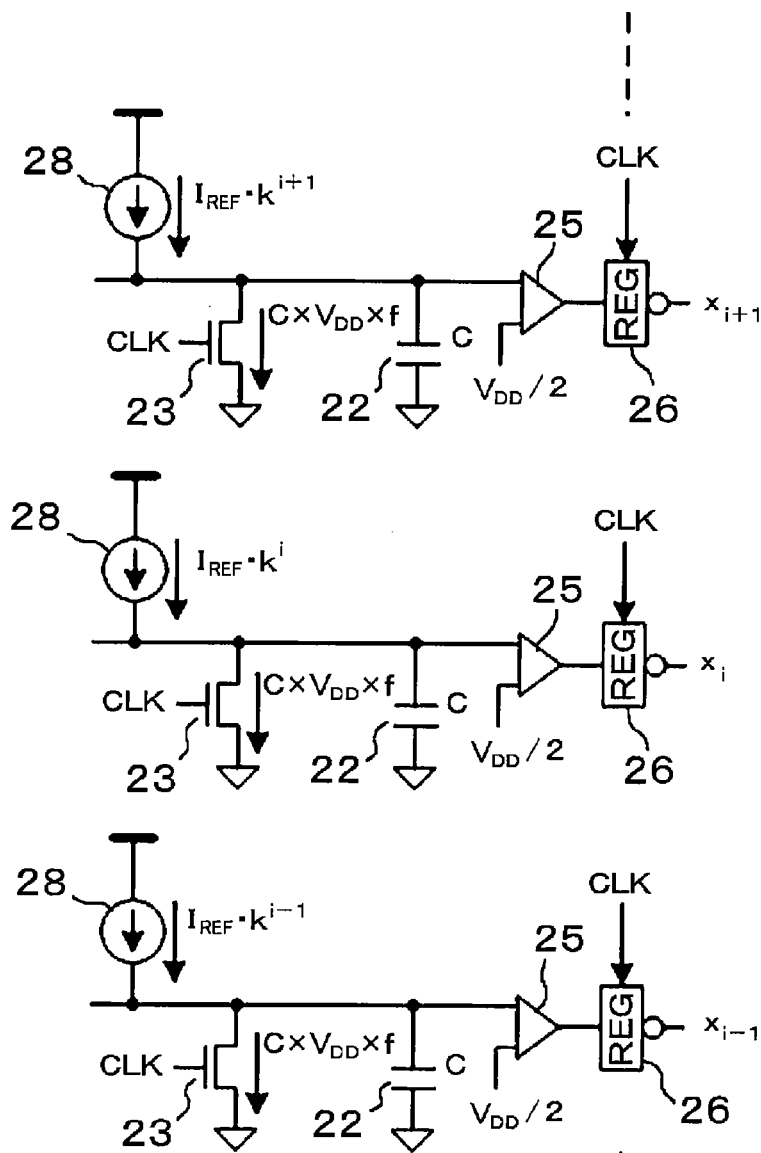
FIG. 26 is a circuit diagram showing still another example of the switching current observer.

Similarly, in a switching current observer shown in FIG. 26, each unit circuit comprises capacitor (C) 22, precharging nMOS transistor 23 connected parallel to capacitor C, reference current generating circuit 24 for generating reference current $I_{REF}$, comparing circuit 25, and register 26. Reference current $I_{REF}$ generated by reference current generating circuit 24 is supplied to the parallel-connected assembly of capacitor 22 and nMOS transistor 23.

Figure 27:
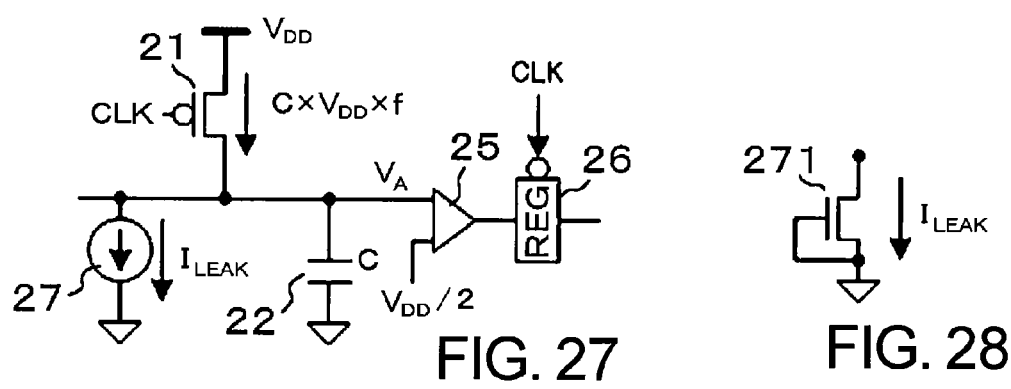
FIG. 27 is a circuit diagram showing an arrangement of a switching current-leakage current comparing semiconductor integrated circuit device based on the present invention.

FIG. 27 shows an example of an arrangement of a switching current-leakage current comparing semiconductor integrated circuit device based on the present invention. The circuit shown in FIG. 27 comprises precharging pMOS transistor 21, capacitor (C) 22, leakage current generating circuit 27, comparing circuit 25, and register 26. Leakage current generating circuit 27 may be a leakage current observing circuit as it may observe a leakage current and output a current depending on the observed result. pMOS transistor 21 and capacitor 22 are connected in series to each other between power supply voltage $V_{DD}$ and the ground potential, and leakage current generating circuit 27 is connected parallel to capacitor C. Comparing circuit 25 compares voltage $V_A$ at a junction (comparison node) between pMOS transistor 21 and capacitor 22 with a one-half value ($V_{DD}/2$) of power supply voltage $V_{DD}$. The comparison result is read into register 26 in synchronism with clock signal CLK.

Arrangements of the leakage current observer according to the present invention will be described below. FIGS. 28 to 37 show arrangements of the leakage current observer.

Figure 28:
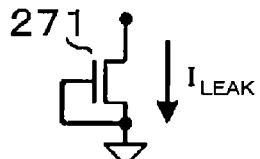
FIG. 28 is a circuit diagram showing an example of a leakage current observer.

The circuit shown in FIG. 28 comprises nMOS transistor 271 in an off-state with the gate terminal and the source terminal being connected to each other. A current flowing through nMOS transistor 271 in the off-state is leakage current $I_{LEAK}$. The circuit shown in FIG. 29 comprises pMOS transistor 272 in the circuit design shown in FIG. 28.

Figure 30:
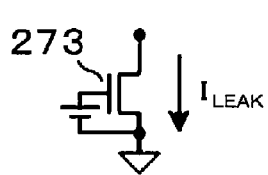
FIG. 30 is a circuit diagram showing still another example of the leakage current observer.
Figure 31:
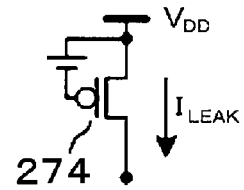
FIG. 31 is a circuit diagram showing yet another example of the leakage current observer.

In the MOS transistor constituting the leakage current observer, it is possible to apply a bias between the gate and the source when the leakage current is small and the layout scale has to be increased to observe the leakage current or when the leakage current is too large. The circuit shown in FIG. 30 is of an arrangement in which biased nMOS transistor 273 is used in the circuit design shown in FIG. 28. Likewise, the circuit shown in FIG. 31 is of an arrangement in which biased pMOS transistor 274 is used in the circuit design shown in FIG. 29.

Figure 29:
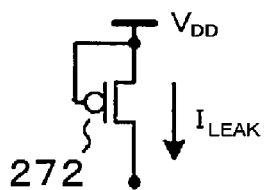
FIG. 29 is a circuit diagram showing another example of the leakage current observer.
Figure 32:
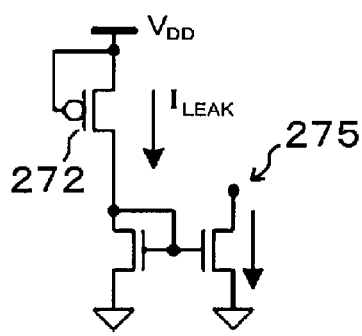
FIG. 32 is a circuit diagram showing yet still another example of the leakage current observer.
Figure 33:
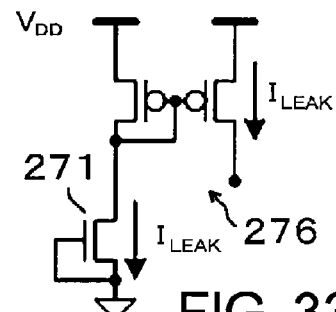
FIG. 33 is a circuit diagram showing a further example of the leakage current observer.

The circuit shown in FIG. 32 includes current mirror 275 added to the circuit shown in FIG. 29 for changing the direction in which the leakage current flows. Similarly, the circuit shown in FIG. 33 includes current mirror 276 added to the circuit shown in FIG. 28 for changing the direction in which the leakage current flows.

Figure 34:
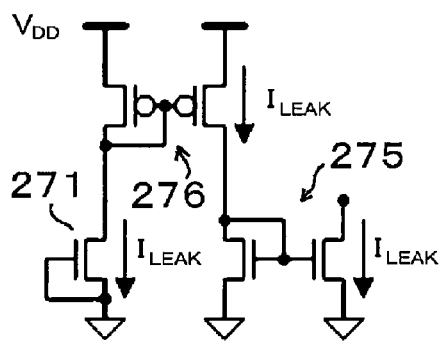
FIG. 34 is a circuit diagram showing a still further example of the leakage current observer.
Figure 35:
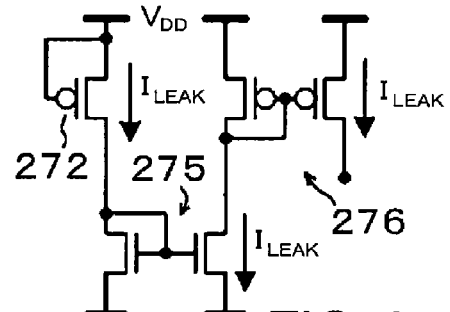
FIG. 35 is a circuit diagram showing a yet further example of the leakage current observer.

The circuit shown in FIG. 34 is of an arrangement in which current mirrors 275, 276 are connected to the circuit shown in FIG. 28 for making the drain-to-source voltage independent of the comparison voltage of a comparing circuit that is connected to the leakage current observer. Similarly, the circuit shown in FIG. 35 is of an arrangement in which current mirrors 275, 276 are connected to the circuit shown in FIG. 29 for making the drain-to-source voltage independent of the comparison voltage of a comparing circuit that is connected to the leakage current observer.

Figure 36:
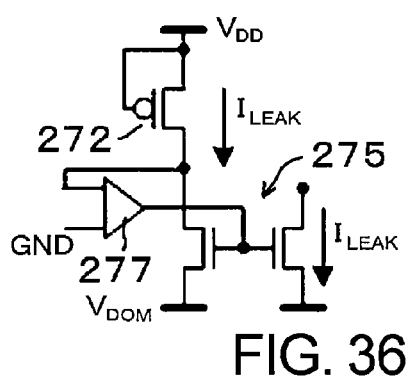
FIG. 36 is a circuit diagram showing a yet still further example of the leakage current observer.
Figure 37:
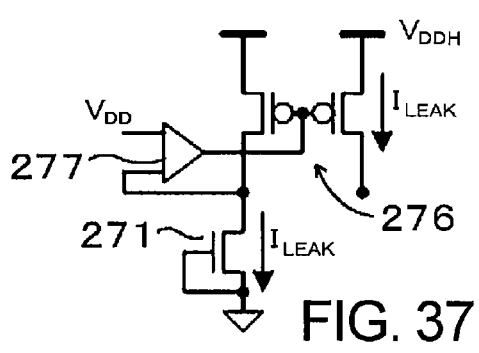
FIG. 37 is a circuit diagram showing still another example of the leakage current observer.

The circuit shown in FIG. 36 is of an arrangement in which differential amplifier 277 is inserted in current mirror 275 of the circuit shown in FIG. 32 for applying the power supply voltage to the drain-to-source voltage. Ground potential GND is supplied to the other input terminal of differential amplifier 277. Similarly, the circuit shown in FIG. 37 is of an arrangement in which differential amplifier 277 is inserted in current mirror 276 of the circuit shown in FIG. 33 for applying power supply voltage $V_{DD}$ to the drain-to-source voltage. Power supply voltage $V_{DD}$ is supplied to the other input terminal of differential amplifier 277.

Figure 38:
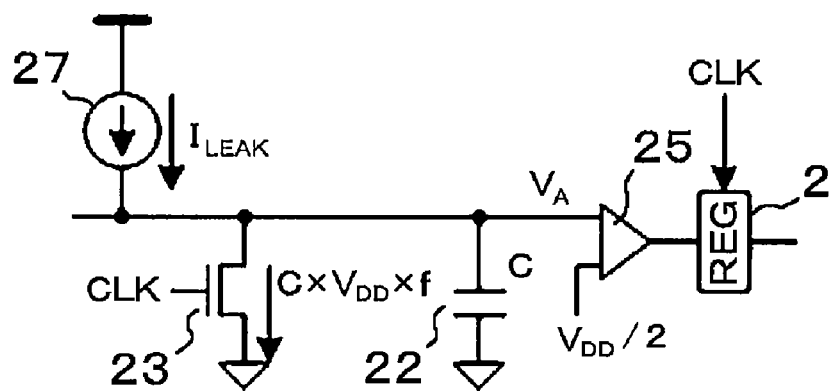
FIG. 38 is a circuit diagram showing an another example of the arrangement of the switching current-leakage current comparing semiconductor integrated circuit device based on the present invention.

FIG. 38 shows another example of the arrangement of the switching current-leakage current comparing semiconductor integrated circuit device based on the present invention. The circuit shown in FIG. 38 is similar to the circuit shown in FIG. 27, and comprises capacitor (C) 22, precharging nMOS transistor 23 connected parallel to capacitor C, leakage current generating circuit 27 connected to the parallel-connected assembly of capacitor 22 and precharging nMOS transistor 23, comparing circuit 25, and register 26.

Figure 39:
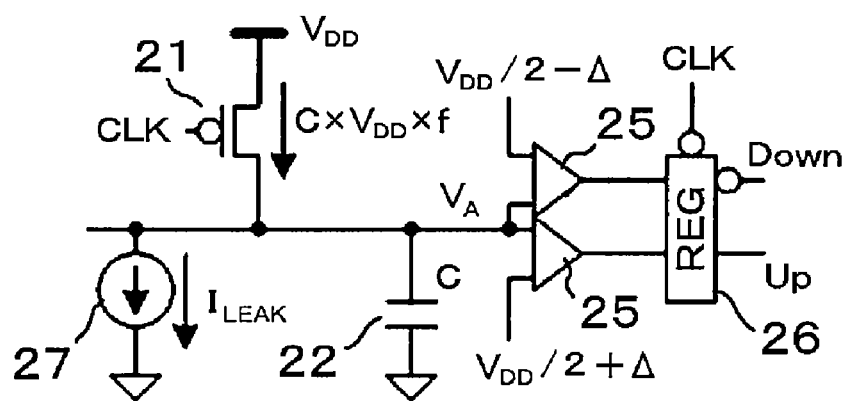
FIG. 39 is a circuit diagram showing still another example of the arrangement of the switching current-leakage current comparing semiconductor integrated circuit device.
Figure 40:
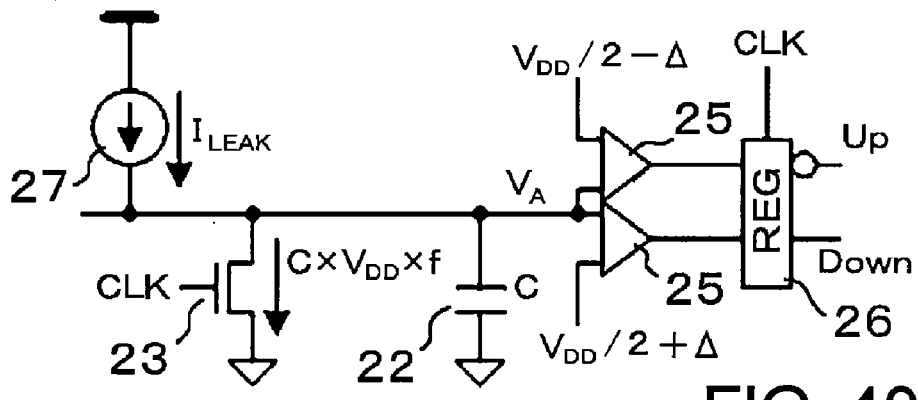
FIG. 40 is a circuit diagram showing yet another example of the arrangement of the switching current-leakage current comparing semiconductor integrated circuit device.

FIG. 39 shows yet another example of the arrangement of the switching current-leakage current comparing semiconductor integrated circuit device. The circuit shown in FIG. 39 includes two comparing circuits 25 in the circuit shown in FIG. 27. One of the comparing circuits compares reference voltage $V_{DD}/2+\Delta$ with $V_A$ and generates an Up signal. The other comparing circuit compares reference voltage $V_{DD}/2-\Delta$ with $V_A$ and generates a Down signal. In this circuit, Up and Down signals are separately generated to provide a hold state with a fixed threshold value. Similarly, as shown in FIG. 40, two comparing circuits 25 may be provided in the arrangement shown in FIG. 38.

Figure 41:
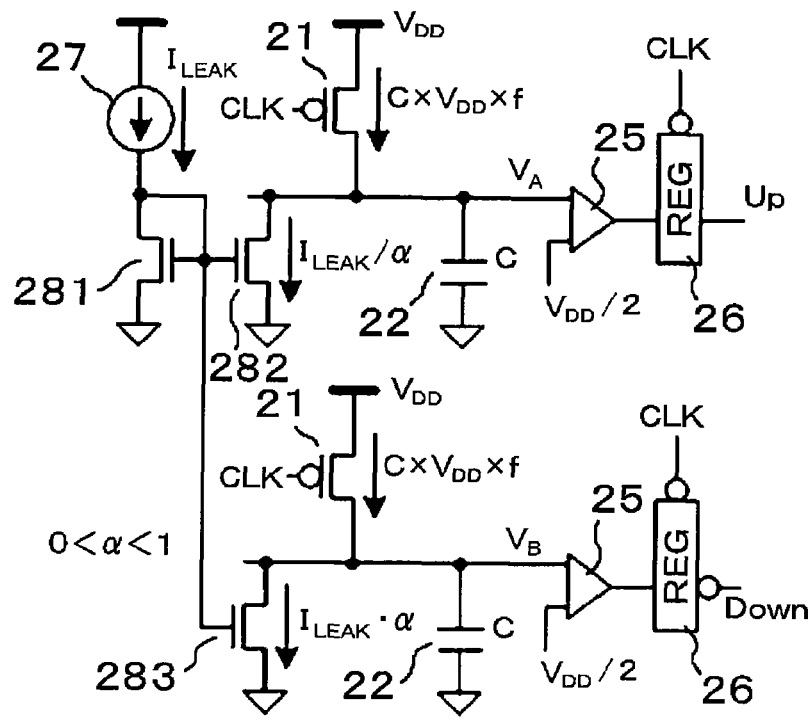
FIG. 41 is a circuit diagram showing yet still another example of the arrangement of the switching current-leakage current comparing semiconductor integrated circuit device.

FIG. 41 shows yet still another example of the arrangement of the switching current-leakage current comparing semiconductor integrated circuit device. The circuit shown in FIG. 41 includes two circuits each shown in FIG. 27, providing a current mirror circuit. One of the circuits uses leakage current $I_{LEAK}/\alpha$ to generate an Up signal, and the other circuit uses leakage current $I_{LEAK}\cdot\alpha$ to generate a Down signal. The comparison node voltage in one of the circuits is represented by $V_A$, whereas the comparison node voltage in the other circuit by $V_B$. Here, nMOS transistors 281 to 283 make up a current mirror. Leakage current $I_{LEAK}$ generated by leakage current generating circuit 27 flows through nMOS transistor 281, causing nMOS transistor 282 of one of the circuits to generate leakage current $I_{LEAK}/\alpha$ and causing nMOS transistor 283 of the other circuit to generate leakage current $I_{LEAK}\cdot\alpha$. In this circuit, Up and Down signals are also separately generated to provide a hold state with a fixed threshold value.

Figure 42:
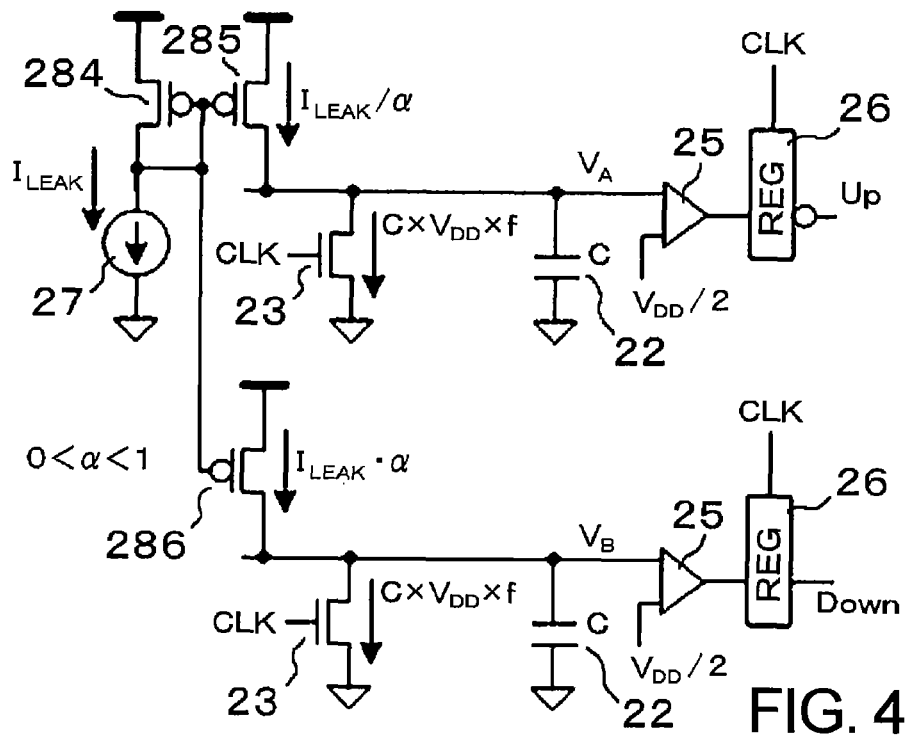
FIG. 42 is a circuit diagram showing a further example of the arrangement of the switching current-leakage current comparing semiconductor integrated circuit device.

Likewise, a circuit shown in FIG. 42 includes two circuits each shown in FIG. 38, providing a current mirror circuit. One of the circuits uses leakage current $I_{LEAK}/\alpha$ to generate an Up signal, and the other circuit uses leakage current $I_{LEAK}\cdot\alpha$ to generate a Down signal. Here, pMOS transistors 284 to 286 make up a current mirror.

Figure 43:
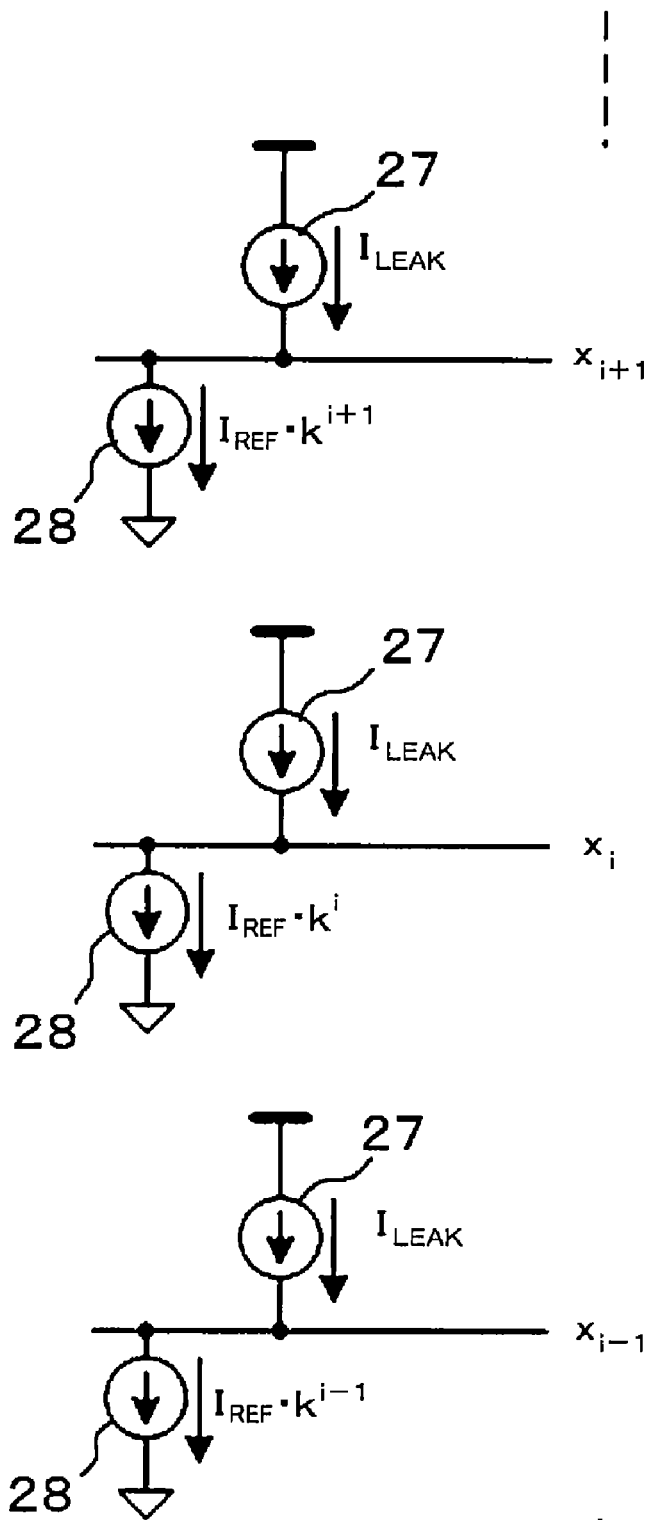
FIG. 43 is a circuit diagram showing yet another example of the leakage current observer.
Figure 44:
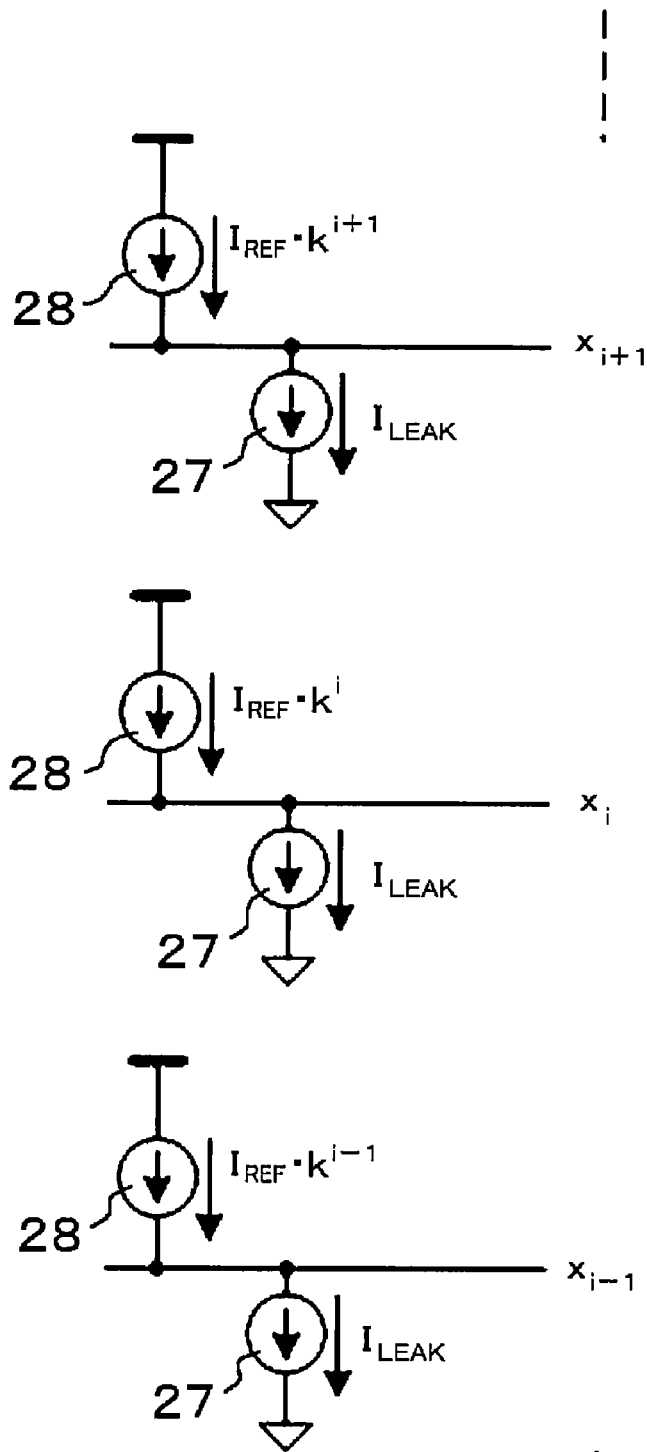
FIG. 44 is a circuit diagram showing yet still another example of the leakage current observer.

A switching current observer shown in FIG. 43 comprises a plurality of unit circuits each including leakage current generating circuit (leakage current generating transistor) 27 and reference current generating circuit 28. Reference currents provided at a plurality of levels allow a bit string to be generated depending on the leakage current. Similarly, a switching current observer shown in FIG. 44 comprises a plurality of unit circuits each including leakage current generating circuit (leakage current generating transistor) 27 and reference current generating circuit 28.

In each of the above exemplary embodiments, if the comparing circuit compares currents, then the comparing circuit can be realized by connecting a comparison current line and comparing the node thereof using a voltage comparing circuit. The voltage comparing circuit can be realized by a differential amplifying circuit and a buffer circuit.

The threshold voltage control circuit can be realized by a charge pump or a regulator for controlling the substrate bias potential. The substrate bias potential is controlled in a range from a forward potential to a reverse potential. The substrate bias potential may be controlled only in a range of reverse potentials or may be controlled only in a range of forward potentials. Upper and lower limits may be provided in the range of substrate bias potentials.

The power supply voltage control circuit can be realized by a regulator for controlling the power supply voltage.

The arrangements of the comparing circuit, the threshold voltage control circuit, and the power supply voltage control circuit are well known to the person skilled in the art, and will not be described below.

Figure 45:
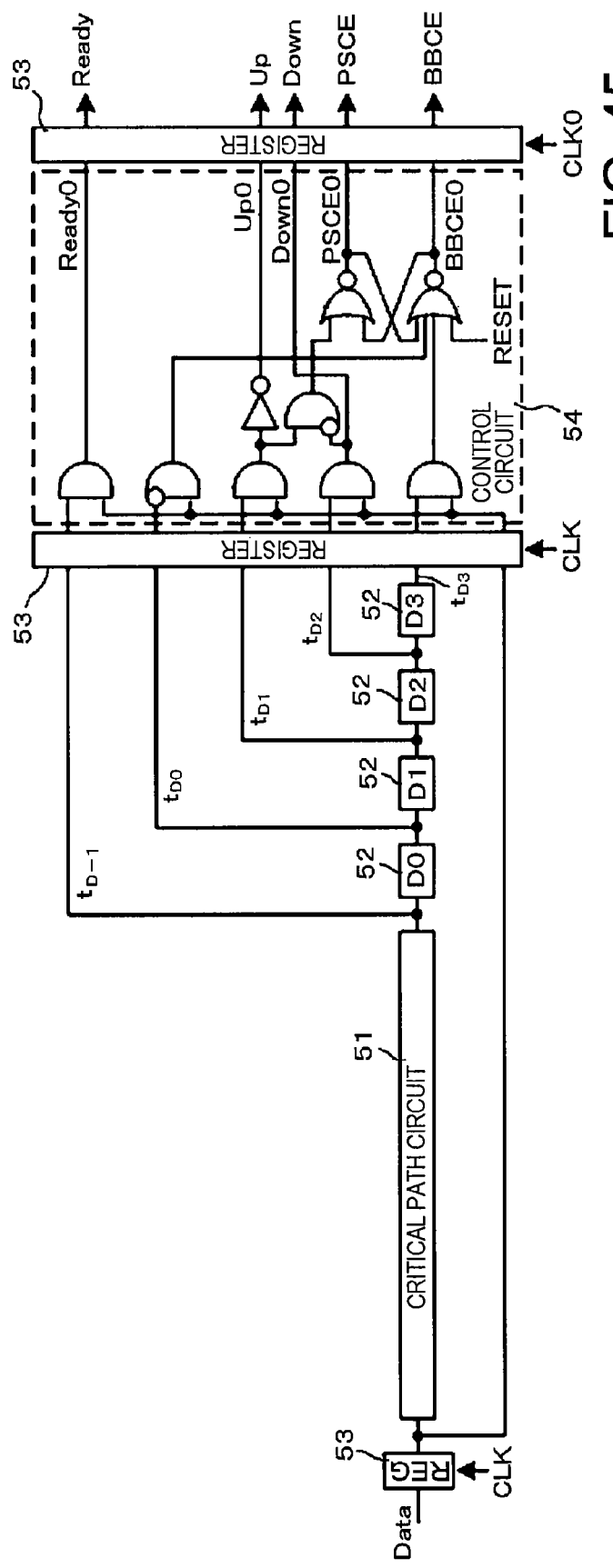
FIG. 45 is a circuit diagram showing an arrangement of a delay observer and a control switcher.
Figure 46:
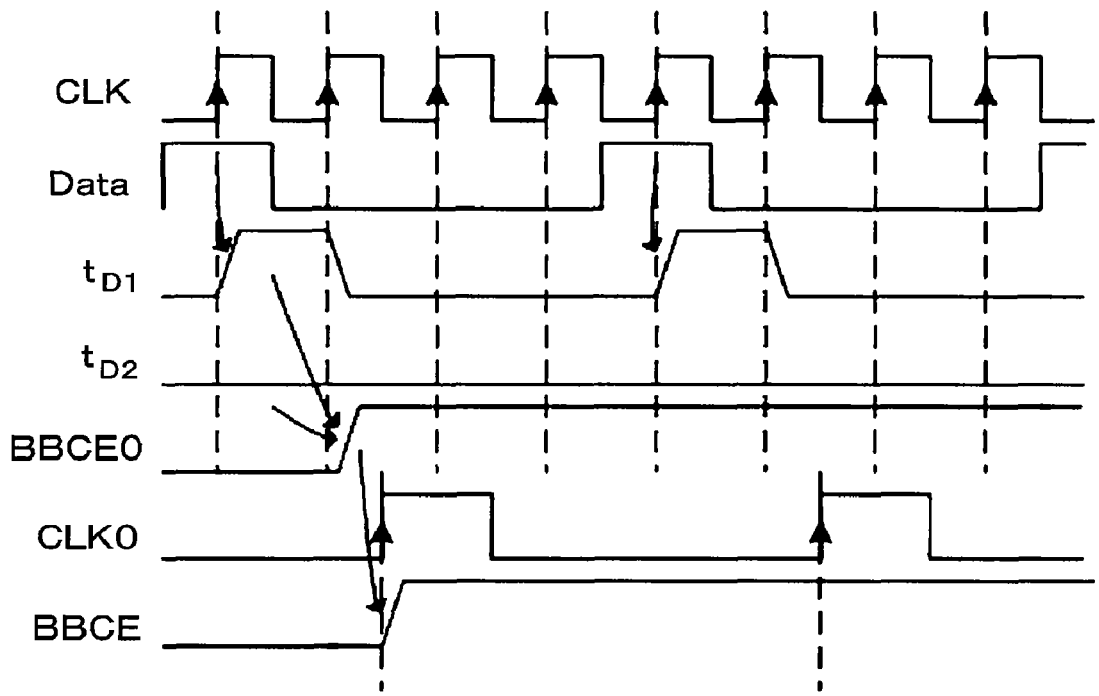
FIG. 46 is a timing chart showing an operation sequence of a delay observer and the control switcher in the circuit shown in FIG. 45.

FIG. 45 shows an example of the arrangement of the delay observer and the control switcher. The illustrated circuit comprises critical path circuit 51, margin delay circuits 52, registers 53, and control circuit 54. Delay circuits 52 are provided as four series-connected stages connected to the output of critical path circuit 51 for generating signals $t_{D-1}$, $t_{D0}$, $t_{D1}$, $t_{D2}$, $t_{D3}$. Signals $t_{D-1}$, $t_{D0}$, $t_{D1}$, $t_{D2}$, $t_{D3}$ are read into register 53 in synchronism with clock CLK, and supplied to control circuit 54. Control circuit 54 outputs a power supply voltage control enable signal (PSCE) and a threshold voltage control enable signal (BBCE) and also outputs an up signal and a down signal for increasing and decreasing the power supply voltage according to the flowchart shown in FIG. 5, and outputs an operability signal (Ready) according to the flowchart shown in FIG. 6. Use of a RESET signal can reliably start operating from the power supply voltage control mode. A timing chart for outputting BBCE is shown in FIG. 46.

Figure 47:
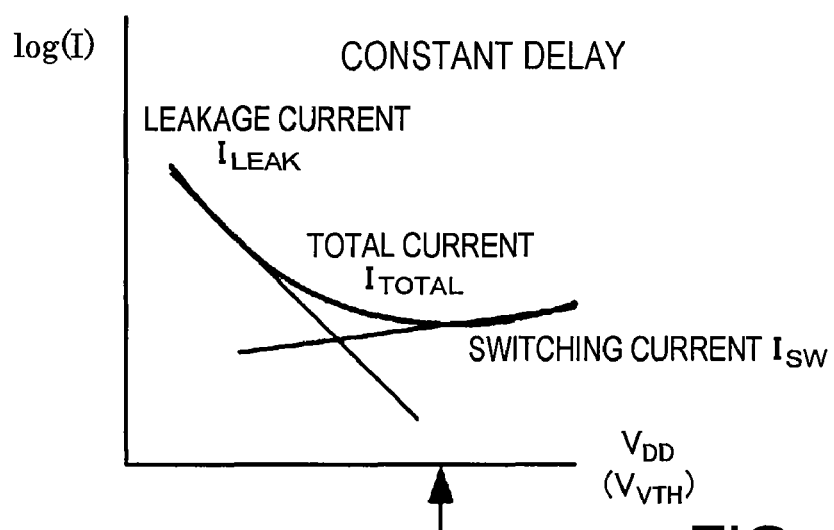
FIG. 47 is a graph showing the relationship between an operational current, and a switching current and a leakage current which are components of the operational current at a constant operational rate.

As shown in FIG. 47, under the condition of a constant operating speed, the operating current of the semiconductor integrated circuit device, i.e., total current $I_{TOTAL}$ comprises switching current $I_{SW}$ and leakage current $I_{LEAK}$ as its components. The operating current of the semiconductor integrated circuit device becomes minimum at certain power supply voltage $V_{DD}$ and threshold voltage $V_{TH}$ corresponding thereto.

Figure 48:
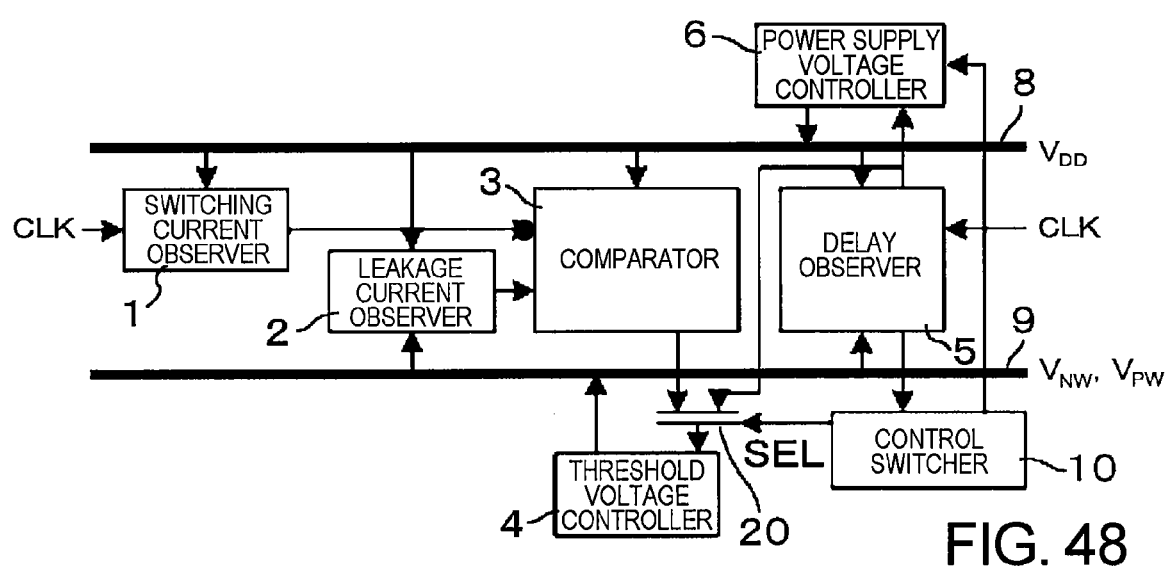
FIG. 48 is a block diagram showing an arrangement of a semiconductor integrated circuit device according to a fifth exemplary embodiment of the present invention.

A semiconductor integrated circuit device according to still another exemplary embodiment of the present invention will be described below. FIG. 48 shows an overall arrangement of a semiconductor integrated circuit device according to a fifth exemplary embodiment of the present invention. This semiconductor integrated circuit device is similar to the circuit shown in FIG. 4, but differs therefrom in that in the power supply voltage control, control switcher 10 supplies the same control signal as the control signal supplied from delay observer 5 to power supply voltage controller 6 to threshold voltage controller 4 to control the substrate voltage for compensating for a change in the threshold value due to a change in the power supply voltage. In the threshold voltage control, the control signal from comparator 3 is supplied to threshold voltage controller 4 to control the substrate voltage, as with the cases described above. For enabling the control of the substrate voltage in this manner, the semiconductor integrated circuit device includes selector switch 20 for selectively inputting the control signal from comparator 3 and the control signal from delay observer 5 to threshold voltage controller 4. Selector switch 20 is controlled by control switching signal SEL from control switcher 10 to select and supply either one of the control signals to threshold voltage controller 4.

Figure 49:
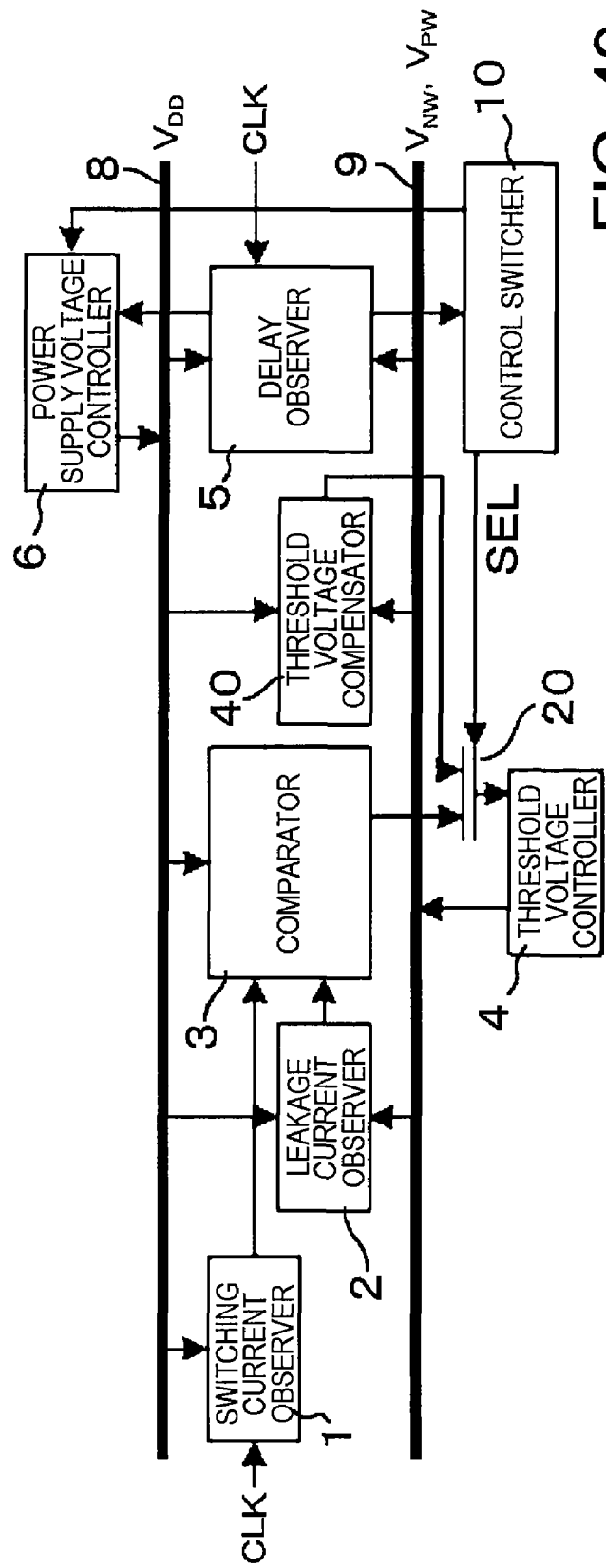
FIG. 49 is a block diagram showing an arrangement of a semiconductor integrated circuit device according to a sixth exemplary embodiment of the present invention.

FIG. 49 shows an overall arrangement of a semiconductor integrated circuit device according to a sixth exemplary embodiment of the present invention. The semiconductor integrated circuit device shown in FIG. 49 is similar to the circuit shown in FIG. 4, but differs therefrom in that it includes threshold voltage compensator 40 for compensating for a change in threshold value $V_{TH}$ due to a change in power supply voltage $V_{DD}$ in the power supply voltage control. Threshold voltage compensator 40 is supplied with power supply voltage $V_{DD}$ and generates a control signal to be supplied to threshold voltage controller 4 for changing the threshold value in accordance with a change in power supply voltage $V_{DD}$. In the power voltage control, control switcher 10 supplies the control signal from threshold voltage compensator 40 to threshold voltage controller 4 to control the substrate voltage for compensating for a change in the threshold value due to a change in the power supply voltage. In the threshold voltage control, the control signal from comparator 3 is supplied to threshold voltage controller 4 to control the substrate voltage, as with the cases described above. For enabling the control of the substrate voltage in this manner, the semiconductor integrated circuit device includes selector switch 20 for selectively inputting the control signal from comparator 3 and the control signal from threshold voltage compensator 40 to threshold voltage controller 4. Selector switch 20 is controlled by control switching signal SEL from control switcher 10 to select and supply either one of the control signals to threshold voltage controller 4.

Figure 50:
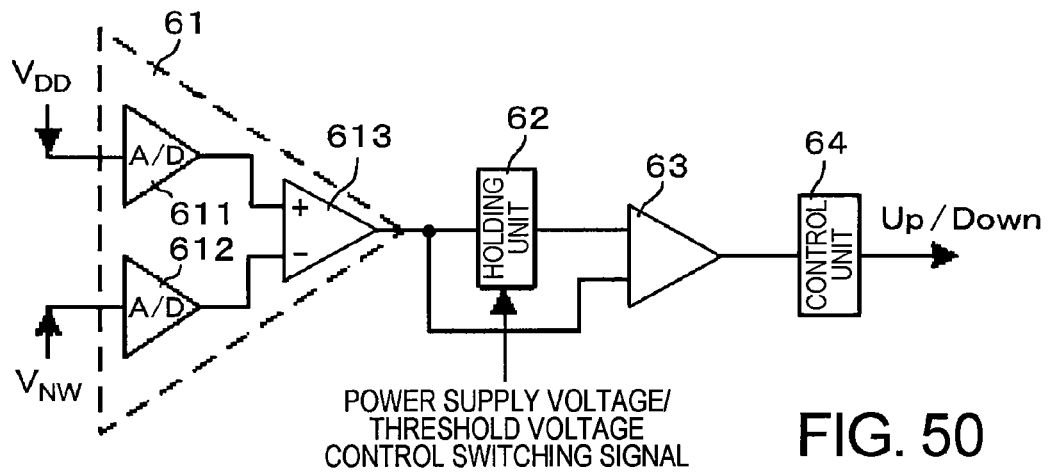
FIG. 50 is a block diagram showing an example of a threshold value compensator.

FIG. 50 shows an example of an arrangement of threshold value compensator 40. Threshold value compensator 40 comprises: comparator 61 which is supplied with substrate voltage (n-well bias voltage) $V_{NW}$ and power supply voltage (source voltage) $V_{DD}$ and determines voltage $V_{BS}$ representing the difference between the substrate voltage and the source voltage (power supply voltage) upon switching to the power supply voltage control; holding unit 62 for holding voltage $V_{BS}$ representing the difference; comparator 63 for comparing voltages $V_{BS}$ before and after switching to the power supply voltage control by comparing the output of comparator 61 and the value held in holding unit 62; and control unit 64 for generating an Up or Down control signal to increase or decrease the substrate voltage (n-well bias voltage $V_{NW}$) depending on the comparison result from comparator 63. Here, holding unit 62 is supplied with control switching signal SEL, determines switching to the power supply voltage control based on control switching signal SEL, and holds the output from comparator 61.

Comparator 61 comprises A/D (analog/digital) converter 611 for converting power supply voltage $V_{DD}$ into a digital value, A/D (analog/digital) converter 612 for converting substrate voltage $V_{NW}$ into a digital value, and subtractor 613 for determining the difference between the output from A/D converter 611 and the output from A/D converter 612.

Figure 51:
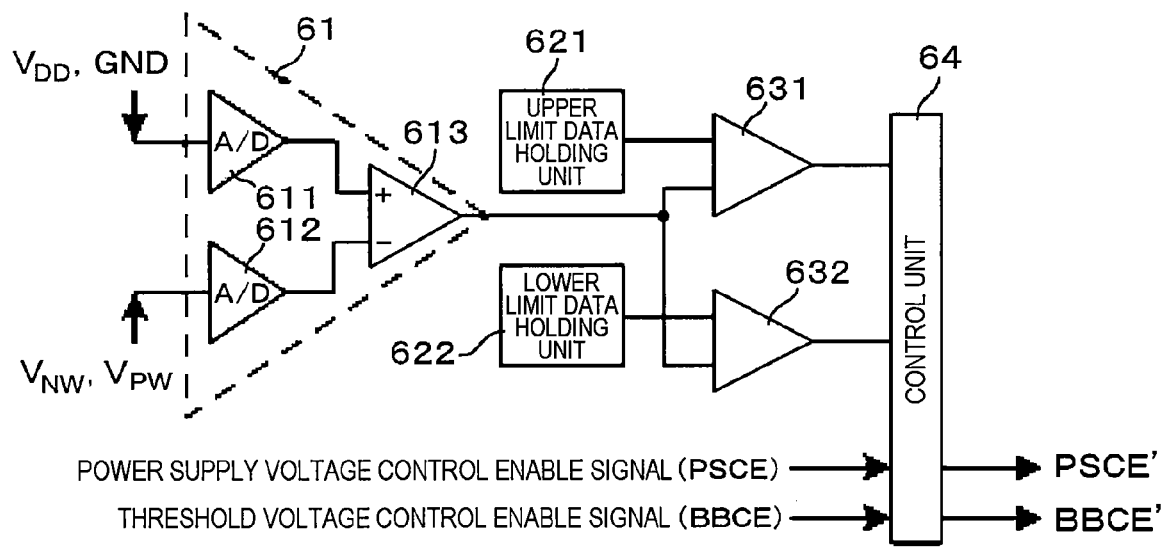
FIG. 51 is a block diagram showing an arrangement of an additional portion of the control switcher.

FIG. 51 shows another example of the arrangement of control switcher 10 according to the present invention. Control switcher 10 switches between the power supply voltage control and the threshold voltage control in the manner described in the exemplary embodiments described above, and also switches the control depending on whether the value of substrate-to-source voltage $V_{BS}$ of the transistor is in a predetermined range or not. Therefore, FIG. 51 shows only a portion of control switcher 10 for performing control mode switching depending on substrate-to-source voltage $V_{BS}$, i.e., an additional portion. The circuit portion shown in FIG. 51 is supplied with power supply voltage control enable signal PSCE and threshold voltage control enable signal BBCE. These signals are supplied from, for example, the circuit shown in FIG. 45, i.e., the control switcher exclusive of the additional portion of the example shown in FIG. 51.

The circuit shown in FIG. 51 switches from the power supply voltage control to the threshold voltage control or from the threshold voltage control to the power supply voltage control to control substrate-to-source voltage $V_{BS}$ of the transistor to fall into a predetermined range when $V_{BS}$ reaches a predetermined range limit, i.e., an upper limit or a lower limit. Specifically, the circuit shown in FIG. 51 comprises: comparator 61 for being supplied with power supply voltage $V_{DD}$ (or GND power supply voltage) and the substrate voltage and determining voltage $V_{BS}$; upper limit data holding unit 621 for storing an allowable upper limit for $V_{BS}$; a lower limit data holding unit 622 for storing an allowable lower limit for $V_{BS}$; comparators 631, 632 for comparing $V_{BS}$ with the upper and lower limits; and control unit 64 for being supplied with power supply voltage control enable signal PSCE and threshold voltage control enable signal BBCE and outputting power supply voltage control enable signal PSCE' or threshold voltage control enable signal BBCE' depending on the comparison results from comparators 631, 632. Here, the substrate voltage represents n-well bias voltage $V_{NW}$ or p-well bias voltage $V_{PW}$.

Figure 52:
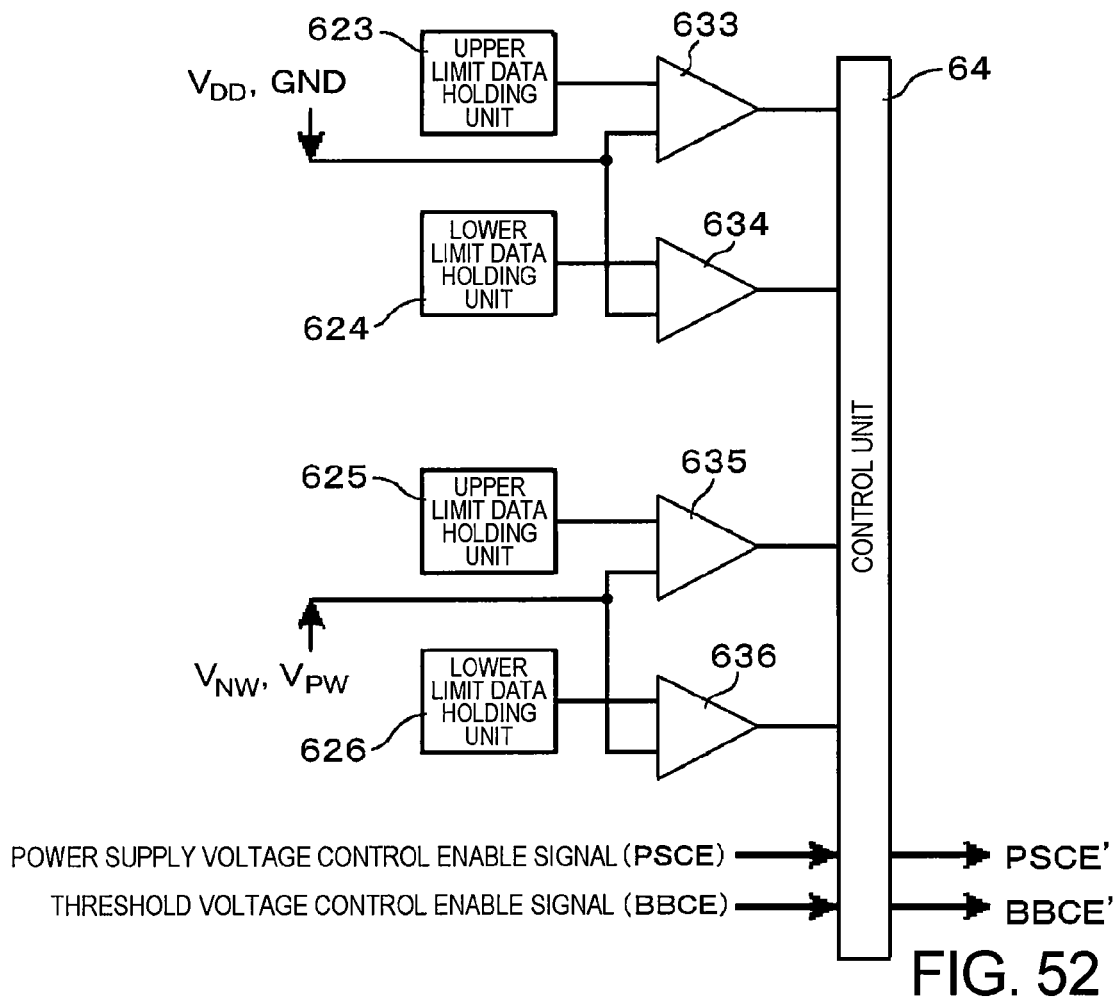
FIG. 52 is a block diagram showing another example of the arrangement of the additional portion of the control switcher.

FIG. 52 shows still another control switcher according to the present invention. As with the case of FIG. 51, FIG. 52 shows the additional portion of the control switcher. Control switcher 10 shown in FIG. 52 operates to switch to the threshold voltage control when power supply voltage $V_{DD}$ reaches predetermined upper and lower limits in the power supply voltage control, and to switch to the power supply voltage control when the threshold voltage or the substrate voltage reaches predetermined upper and lower limits in the threshold voltage control. The substrate voltage represents n-well bias voltage $V_{NW}$ or p-well bias voltage $V_{PW}$. By thus operating, the circuit shown in FIG. 52 makes it possible to change to an optimum power supply voltage or an optimum threshold voltage which has been difficult to achieve due to the dead zone of delay observer 5.

Control switcher 10 shown in FIG. 52 comprises: upper limit data holding unit 623 and lower limit data holding unit 624 for holding upper and lower limit values, respectively, for the power supply voltage; comparators 633, 634 for comparing power supply voltage $V_{DD}$ (or GND power supply voltage) with the upper and lower limits values stored in holding units 623, 624; upper limit data holding unit 625 and lower limit data holding unit 626 for holding upper and lower limit values, respectively, for the substrate voltage; comparators 635, 636 for comparing the substrate voltage with the upper and lower limits values stored in holding units 625, 626; and control unit 64 for being supplied with power supply voltage control enable signal PSCE and threshold voltage control enable signal BBCE and outputting power supply voltage control enable signal PSCE' or threshold voltage control enable signal BBCE' depending on the comparison results from comparators 633 to 636.

Figure 53:
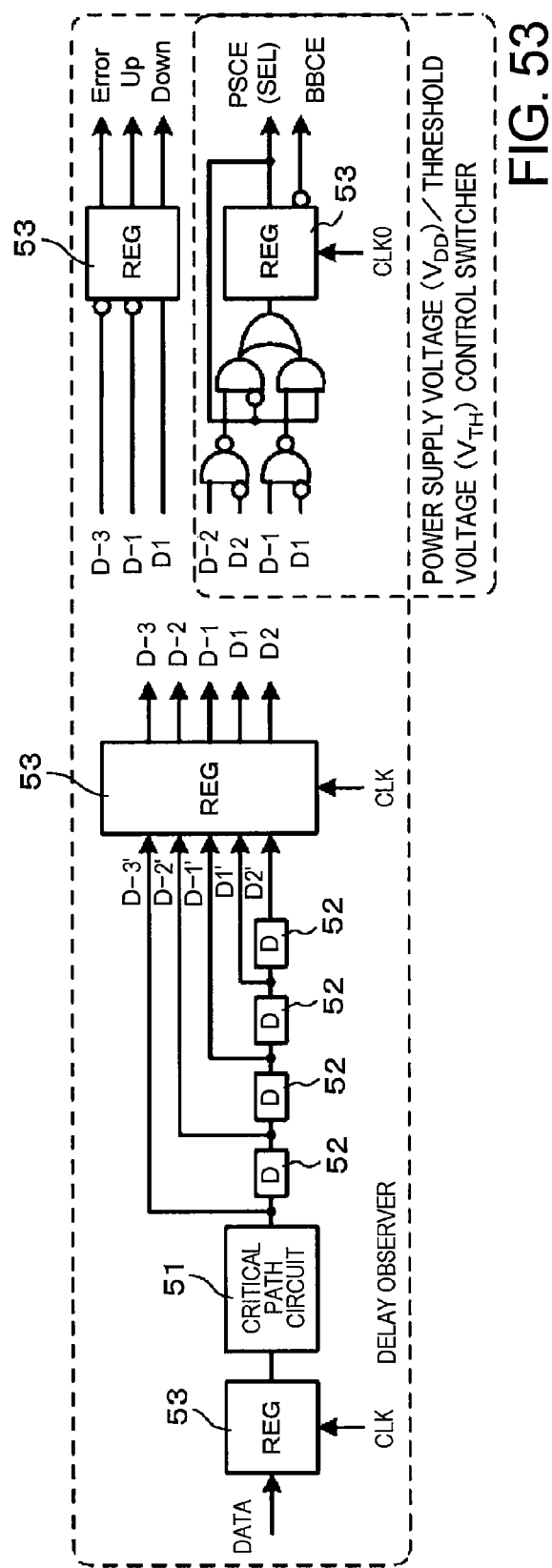
FIG. 53 is a circuit diagram showing a delay observer and a control switcher.

FIG. 53 shows yet another example of the arrangement of the delay observer and the control switcher according to the present invention. As with the circuit shown in FIG. 45, the circuit comprises: input register 53 which is synchronized with clock CLK; critical path circuit 51 connected to the output of input register 53; a plurality of cascaded delay circuits 52, one end of the cascaded connection of delay circuits being connected to the output of critical path circuit 51; output register 53 which is synchronized with clock CLK that is connected to the output of critical path circuit 51 and the respective outputs of delay circuits 52; and a control circuit provided on the output side of output register 53 for generating respective signals such as error, Up, Down, PSCE (and SEL), BBCE, etc. The delay observer determines a delay amount based on the timing relationship between the output values from respective delay circuits 52 and clock CLK. Particularly, the circuit is supplied with output D-3' of critical path circuit 51 and outputs D-2', D-1', D1', D2' of the respective delay circuits, and output register 53 determines the delay amount from the relationship between the edge of clock CLK and the edges of the outputs of the respective delay circuits. For example, the circuit determines whether the edge of clock CLK is present prior to the edge of D-2', or between the edge of D-1' and the edge of D1', or subsequent to the edge of D2'. If the edge of clock CLK is present prior to the edge of D-2' or subsequent to the edge of D2', then the control switcher switches to the power supply voltage ($V_{DD}$) control, and if the edge of clock CLK is present between the edge of D-1' and the edge of D1', then the control switcher switches to the threshold voltage ($V_{TH}$) control.

Figure 55:
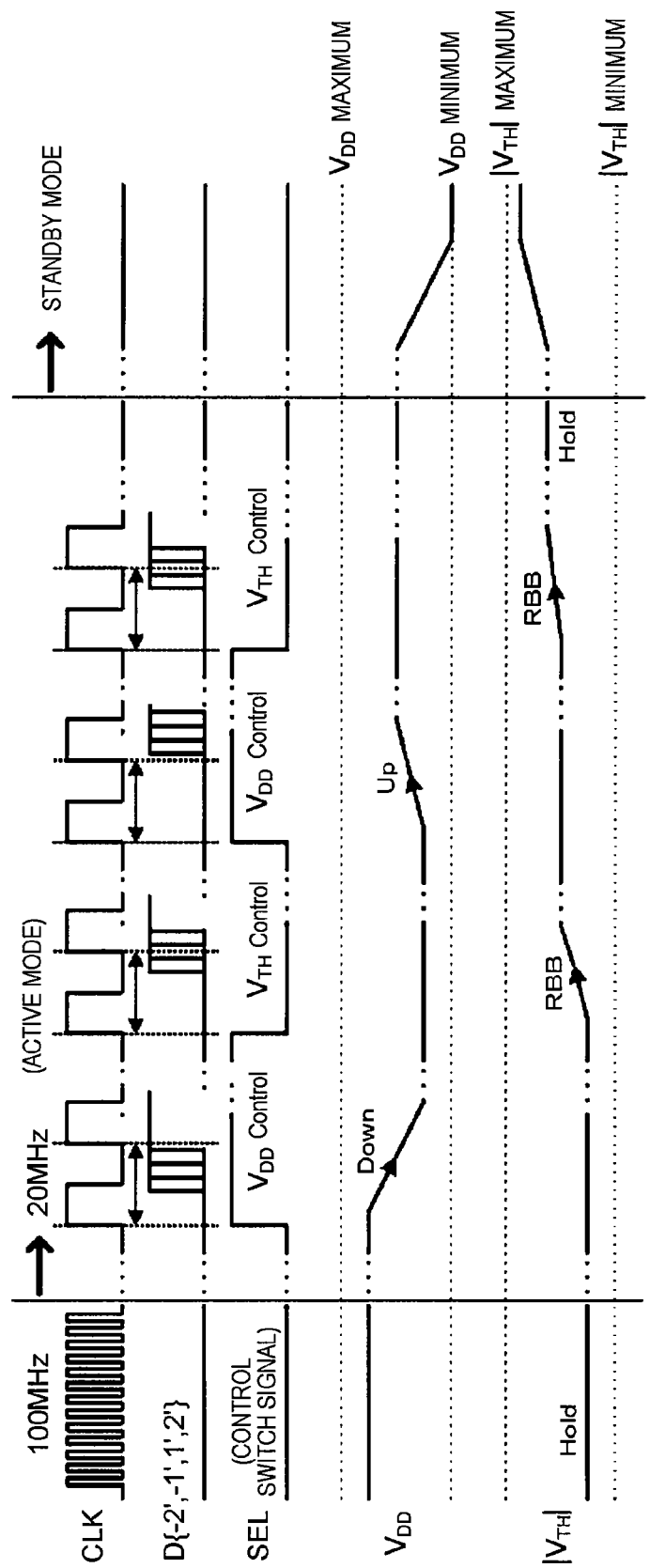
FIG. 55 is a timing chart showing the operation sequence of the delay observer and the control switcher in the circuit shown in FIG. 53.

FIG. 54 is a truth table showing an operation sequence of the delay observer and the control switcher in the circuit shown in FIG. 53. FIG. 55 is a timing chart showing the operation sequence of the delay observer and the control switcher in the circuit shown in FIG. 53. As shown, according to the relationship between the clock period and the delay as determined by the delay observer, switching takes placed between the power supply voltage control and the threshold voltage control to perform the power supply voltage control and the threshold voltage control for converging to the power supply voltage and the threshold voltage to minimize the operational power.

INDUSTRIAL APPLICABILITY

Applications of the present invention include mobile devices such as cellular phone and PDA (personal digital assistant).

The invention claimed is:

1. A semiconductor integrated circuit device comprising:
  switching current observation means for observing a switching current in said semiconductor integrated circuit device;
  leakage current observation means for observing a leakage current in said semiconductor integrated circuit device;
  comparing means for comparing said switching current and said leakage current with each other;
  threshold voltage control means for controlling a threshold voltage of a circuit element of said semiconductor integrated circuit device to make a ratio of said switching current and said leakage current constant;
  delay observation means for observing a delay amount in said semiconductor integrated circuit device; and
  power supply voltage control means for controlling a power supply voltage used to operate said semiconductor integrated circuit device in order to keep said delay amount in a predetermined range.

2. The semiconductor integrated circuit device according to claim 1, wherein said switching current observation means comprises:
  a precharging or predischarging element; and
  a capacitor and/or a parasitic capacitor connected to said precharging or predischarging element.

3. The semiconductor integrated circuit device according to claim 2, wherein said precharging or predischarging element is controlled by a clock signal of a circuit to be controlled or a signal obtained by frequency-dividing said clock signal.

4. The semiconductor integrated circuit device according to claim 2, wherein said precharging or predischarging element is controlled by a clock signal produced by dividing an operating clock frequency of a circuit to be controlled in inverse proportion to an operating ratio of said circuit.

5. The semiconductor integrated circuit device according to claim 1, wherein said switching current observation means comprises:
  a precharging or predischarging element;
  a capacitor and/or parasitic capacitor connected to said precharging or predischarging element;
  a reference current generating circuit for generating a reference current, said reference current generating circuit being connected to said precharging or predischarging element;
  a comparing circuit for comparing a voltage across said capacitor and/or parasitic capacitor with a predetermined voltage; and
  a register for holding a comparison result from said comparing circuit;
  wherein said reference current is adjusted depending on said comparison result held by said register to generate a reference current depending on the switching current.

6. The semiconductor integrated circuit device according to claim 5, wherein said reference current generating circuit comprises: a reference current source, a current mirror array connected to said reference current source; a current switch array connected to an output of said current mirror array; and a control logic circuit for controlling said current switch array, and wherein said reference current generating circuit generates a reference current depending on the comparison result supplied thereto.

7. The semiconductor integrated circuit device according to claim 6, wherein said control logic circuit includes a counter.

8. The semiconductor integrated circuit device according to claim 6, wherein said control logic circuit includes a shift register.

9. The semiconductor integrated circuit device according to claim 5, wherein said reference current generating circuit comprises: a reference current source; a current mirror array connected to said reference current source; a current switch array connected to an output of said current mirror array; and a control logic circuit for controlling said current switch array, and wherein said reference current generating circuit is able to set an initial value and/or a fixed value of the reference current.

10. The semiconductor integrated circuit device according to claim 5, wherein said register is controlled by a clock signal of a circuit to be controlled or a signal obtained by frequency-dividing said clock signal.

11. The semiconductor integrated circuit device according to claim 5, wherein said register is controlled by a clock signal produced by dividing an operating clock frequency of a circuit to be controlled in inverse proportion to an operating ratio of said circuit.

12. The semiconductor integrated circuit device according to claim 1, wherein said switching current observation means comprises:
  a precharging or predischarging element;
  a capacitor and/or parasitic capacitor connected to said precharging or predischarging element;
  a reference current generating circuit for generating a reference current, said reference current generating circuit being connected to said precharging or predischarging element;
  a comparing circuit for comparing a voltage across said capacitor and/or parasitic capacitor with a predetermined voltage; and
  a register for holding a comparison result from said comparing circuit;
  wherein a bit string depending on the switching current is generated by comparison with a plurality of reference currents.

13. The semiconductor integrated circuit device according to claim 1, wherein said leakage current observation means comprises a transistor including a gate terminal and a source terminal between which a bias potential of 0 or a constant value is applied.

14. The semiconductor integrated circuit device according to claim 1, wherein said leakage current observation means comprises a transistor including a drain terminal and a source terminal between which the power supply voltage or a voltage proportional to the power supply voltage is applied.

15. The semiconductor integrated circuit device according to claim 1, wherein said leakage current observation means comprises a leakage current generating transistor for generating the leakage current, a reference current generating circuit for generating a reference current, and a comparing circuit for comparing said leakage current and said reference current with each other, and wherein said leakage current observation means generates a bit string depending on the leakage current by comparison with a plurality of reference currents.

16. The semiconductor integrated circuit device according to claim 1, wherein said comparing means compares a constant ratio of the current to be compared.

17. The semiconductor integrated circuit device according to claim 1, wherein said comparing means includes a wire connection of a signal line through which the current to be compared flows, and a voltage comparing circuit.

18. The semiconductor integrated circuit device according to claim 1, wherein said comparing means includes a comparing circuit for a bit string.

19. The semiconductor integrated circuit device according to claim 1, further comprising control switching means for switching between execution of controlling the power supply voltage control and execution of controlling the threshold voltage.

20. The semiconductor integrated circuit device according to claim 1, wherein said power supply voltage control means and/or said threshold voltage control means is given an initial value.

21. The semiconductor integrated circuit device according to claim 1, further comprising operability signal generating means.

22. The semiconductor integrated circuit device according to claim 1, wherein said threshold voltage control means compensates for a change in a threshold value due to a change in the power supply voltage when the power supply voltage is controlled.

23. The semiconductor integrated circuit device according to claim 1, further comprising threshold value compensating means for compensating for a change in a threshold value due to a change in the power supply voltage when the power supply voltage is controlled.

24. The semiconductor integrated circuit device according to claim 1, wherein said delay observation means comprises: an input register which is synchronized with a clock; a critical path circuit connected to an output of said input register; a plurality of delay circuits which are cascaded to each other, one end of the cascade connection of the delay circuits being connected to an output of said critical path circuit; and an output register which is synchronized with said clock, said output register being connected to the output of said critical path circuit and respective outputs of said delay circuits, and wherein said delay observation means observes said delay amount based on timing relationship between output values from said plurality of delay circuits and said clock.

25. The semiconductor integrated circuit device according to claim 1, wherein said threshold voltage control means varies a floating gate voltage of a floating gate transistor.

26. The semiconductor integrated circuit device according to claim 1, wherein said threshold voltage control means varies voltages of some of the gates of a multigate structure transistor.

27. The semiconductor integrated circuit device according to claim 1, wherein the ratio of said switching current and said leakage current represents a reciprocal of a ratio of absolute values of gradients of respective approximated straight lines, or an integer close to the reciprocal, or a power of 2 close to the reciprocal in a graph having a horizontal axis representative of the power supply voltage and a vertical axis representative of respective logarithmic values of said switching current and said leakage current while a threshold value is varied to keep the delay constant.

28. A semiconductor integrated circuit device comprising:
switching current observation means for observing a switching current in said semiconductor integrated circuit device;
leakage current observation means for observing a leakage current in said semiconductor integrated circuit device;
comparing means for comparing said switching current and said leakage current with each other; and
threshold voltage control means for controlling a threshold voltage of a circuit element of said semiconductor integrated circuit device to make a ratio of said switching current and said leakage current constant.

29. The semiconductor integrated circuit device according to claim 28, wherein said switching current observation means comprises:
a precharging or predischarging element; and
a capacitor and/or a parasitic capacitor connected to said precharging or predischarging element.

30. The semiconductor integrated circuit device according to claim 29, wherein said precharging or predischarging element is controlled by a clock signal of a circuit to be controlled or a signal obtained by frequency-dividing said clock signal.

31. The semiconductor integrated circuit device according to claim 29, wherein said precharging or predischarging element is controlled by a clock signal produced by dividing an operating clock frequency of a circuit to be controlled in inverse proportion to an operating ratio of said circuit.

32. The semiconductor integrated circuit device according to claim 28, wherein said switching current observation means comprises:
a precharging or predischarging element;
a capacitor and/or parasitic capacitor connected to said precharging or predischarging element;
a reference current generating circuit for generating a reference current, said reference current generating circuit being connected to said precharging or predischarging element;
a comparing circuit for comparing a voltage across said capacitor and/or parasitic capacitor with a predetermined voltage; and
a register for holding a comparison result from said comparing circuit;
wherein said reference current is adjusted depending on said comparison result held by said register to generate a reference current depending on the switching current.

33. The semiconductor integrated circuit device according to claim 32, wherein said reference current generating circuit comprises: a reference current source, a current mirror array connected to said reference current source; a current switch array connected to an output of said current mirror array; and a control logic circuit for controlling said current switch array, and wherein said reference current generating circuit generates a reference current depending on the comparison result supplied thereto.

34. The semiconductor integrated circuit device according to claim 32, wherein said reference current generating circuit comprises: a reference current source; a current mirror array connected to said reference current source; a current switch array connected to an output of said current mirror array; and a control logic circuit for controlling said current switch array, and wherein said reference current generating circuit is able to set an initial value and/or a fixed value of the reference current.

35. The semiconductor integrated circuit device according to claim 32, wherein said register is controlled by a clock signal of a circuit to be controlled or a signal obtained by frequency-dividing said clock signal.

36. The semiconductor integrated circuit device according to claim 32, wherein said register is controlled by a clock signal produced by dividing an operating clock frequency of a circuit to be controlled in inverse proportion to an operating ratio of said circuit.

37. The semiconductor integrated circuit device according to claim 28, wherein said switching current observation means comprises:
a precharging or predischarging element;
a capacitor and/or parasitic capacitor connected to said precharging or predischarging element;
a reference current generating circuit for generating a reference current, said reference current generating circuit being connected to said precharging or predischarging element;
a comparing circuit for comparing a voltage across said capacitor and/or parasitic capacitor with a predetermined voltage; and
a register for holding a comparison result from said comparing circuit;
wherein a bit string depending on the switching current is generated by comparison with a plurality of reference currents.

38. The semiconductor integrated circuit device according to claim 28, wherein said leakage current observation means comprises a transistor including a gate terminal and a source terminal between which a bias potential of 0 or a constant value is applied.

39. The semiconductor integrated circuit device according to claim 28, wherein said leakage current observation means comprises a transistor including a drain terminal and a source terminal between which the power supply voltage or a voltage proportional to the power supply voltage is applied.

40. The semiconductor integrated circuit device according to claim 28, wherein said leakage current observation means comprises a leakage current generating transistor for generating the leakage current, a reference current generating circuit for generating a reference current, and a comparing circuit for comparing said leakage current and said reference current with each other, and wherein said leakage current observation means generates a bit string depending on the leakage current by comparison with a plurality of reference currents.

41. The semiconductor integrated circuit device according to claim 28, wherein said comparing means compares a constant ratio of the current to be compared.

42. The semiconductor integrated circuit device according to claim 28, wherein said comparing means includes a wire connection of a signal line through which the current to be compared flows, and a voltage comparing circuit.

43. The semiconductor integrated circuit device according to claim 28, wherein said comparing means includes a comparing circuit for a bit string.

44. The semiconductor integrated circuit device according to claim 28, wherein said threshold voltage control means is given an initial value.

45. The semiconductor integrated circuit device according to claim 28, further comprising operability signal generating means.

46. The semiconductor integrated circuit device according to claim 28, wherein said threshold voltage control means varies a floating gate voltage of a floating gate transistor.

47. The semiconductor integrated circuit device according to claim 28, wherein said threshold voltage control means varies voltages of some of the gates of a multigate structure transistor.

48. The semiconductor integrated circuit device according to claim 28, wherein the ratio of said switching current and said leakage current represents a reciprocal of a ratio of absolute values of gradients of respective approximated straight lines, or an integer close to the reciprocal, or a power of 2 close to the reciprocal in a graph having a horizontal axis representative of the power supply voltage and a vertical axis representative of respective logarithmic values of said switching current and said leakage current while a threshold value is varied to keep the delay constant.

49. A switching current observing semiconductor integrated circuit device comprising:
precharging or predischarging means;
charge storing means connected to said precharging or predischarging means;
reference current generating means for generating a reference current, said reference current generating means being connected to said precharging or predischarging means;
comparing means for comparing a voltage of said charge storing means with a predetermined voltage; and
synchronous memory means for storing a comparison result from said comparing means.

50. The semiconductor integrated circuit device according to claim 49, wherein said precharging or predischarging means is controlled by a clock signal of a circuit to be controlled or a signal obtained by frequency-dividing said clock signal.

51. The semiconductor integrated circuit device according to claim 49, wherein said synchronous memory means is controlled by a clock signal of a circuit to be controlled or a signal obtained by frequency-dividing said clock signal.

52. The semiconductor integrated circuit device according to claim 49, wherein said precharging or predischarging means is controlled by a clock signal produced by dividing an operating clock frequency of a circuit to be controlled in inverse proportion to an operating ratio of said circuit.

53. The semiconductor integrated circuit device according to claim 49, wherein said synchronous memory means is controlled by a clock signal produced by dividing an operating clock frequency of a circuit to be controlled in inverse proportion to an operating ratio of said circuit.

54. A switching current-leakage current comparing semiconductor integrated circuit device comprising:
precharging or predischarging means;
charge storing means connected to said precharging or predischarging means;
leakage current observation means for observing a leakage current in said semiconductor integrated circuit device;
comparing means for comparing a voltage of said charge storing means with a predetermined voltage; and
synchronous memory means for storing a comparison result from said comparing means.

55. The semiconductor integrated circuit device according to claim 54, wherein said precharging or predischarging means is controlled by a clock signal of a circuit to be controlled or a signal obtained by frequency-dividing said clock signal.

56. The semiconductor integrated circuit device according to claim 54, wherein said synchronous memory means is controlled by a clock signal of a circuit to be controlled or a signal obtained by frequency-dividing said clock signal.

57. The semiconductor integrated circuit device according to claim 54, wherein said precharging or predischarging means is controlled by a clock signal produced by dividing an operating clock frequency of a circuit to be controlled in inverse proportion to an operating ratio of said circuit.

58. The semiconductor integrated circuit device according to claim 54, wherein said synchronous memory means is controlled by a clock signal produced by dividing an operating clock frequency of a circuit to be controlled in inverse proportion to an operating ratio of said circuit.

59. A semiconductor integrated circuit device comprising:
power supply voltage control means for controlling a power supply voltage used to operate said semiconductor integrated circuit device;
threshold voltage control means for controlling a threshold voltage of a circuit element of said semiconductor integrated circuit device; and
control switching means for switching between execution of controlling the power supply voltage and execution of controlling the threshold voltage.

60. The semiconductor integrated circuit device according to claim 59, wherein said control switching means switches exclusively between power supply voltage control and threshold voltage control.

61. The semiconductor integrated circuit device according to claim 59, wherein said control switching means switches alternately between power supply voltage control and threshold voltage control.

62. The semiconductor integrated circuit device according to claim 59, wherein said control switching means performs threshold voltage control only under a condition for guaranteeing a rate.

63. The semiconductor integrated circuit device according to claim 59, wherein said control switching means performs threshold voltage control only under a condition for guaranteeing a rate or at an upper or lower control limit of power supply voltage control.

64. The semiconductor integrated circuit device according to claim 59, wherein said power supply voltage control means and/or said threshold voltage control means is given an initial value.

65. The semiconductor integrated circuit device according to claim 59, further comprising operability signal generating means.

66. The semiconductor integrated circuit device according to claim 65, wherein said operability signal generating means outputs an operability signal under a condition for guaranteeing a rate.

67. The semiconductor integrated circuit device according to claim 65, wherein said operability signal generating means outputs an operability signal under a condition for guaranteeing a rate and a condition in which the ratio of the switching current and the leakage current falls in an allowable range.

68. The semiconductor integrated circuit device according to claim 59, wherein said threshold voltage control means compensates for a change in a threshold value due to a change in the power supply voltage when the power supply voltage is controlled.

69. The semiconductor integrated circuit device according to claim 59, wherein said control switching means applies the same control signal as a control signal applied to said power supply voltage control means to said threshold voltage control means to control a substrate voltage for compensating a change in a threshold value due to a change in the power supply voltage when the power supply voltage control is controlled.

70. The semiconductor integrated circuit device according to claim 59, further comprising threshold value compensating means for compensating for a change in a threshold value due to a change in the power supply voltage when the power supply voltage is controlled.

71. The semiconductor integrated circuit device according to claim 70, wherein said threshold value compensating means comprises: first comparing means for comparing a difference between a substrate voltage and a source voltage to determine a first difference upon switching to the power supply voltage control; holding means for holding said first difference; second comparing means for comparing a difference between said substrate voltage and said source voltage after switching to the power supply voltage control with said first difference; and control means for generating a control signal to increase or decrease said substrate voltage depending on a comparison result from said second comparing means.

72. The semiconductor integrated circuit device according to claim 70, wherein said control switching means inputs a control signal from said threshold value compensating means to said threshold voltage control means when the power supply voltage is controlled.

73. The semiconductor integrated circuit device according to claim 59, wherein said control switching means switches between power supply voltage control and threshold voltage control to keep a voltage between a substrate and a source of a transistor in said semiconductor integrated circuit device in a predetermined range limit.

74. The semiconductor integrated circuit device according to claim 59, wherein said control switching means switches to the threshold voltage control if said power supply voltage reaches predetermined upper and lower limits when said power supply voltage is controlled, and switches to the power supply voltage control if said threshold voltage or said substrate voltage reaches predetermined upper and lower limits when said threshold voltage is controlled.

75. The semiconductor integrated circuit device according to claim 59, wherein said control switching means switches to the threshold voltage control if said delay amount obtained by said delay observation means falls in a predetermined range, and switches to the power supply voltage control if said delay amount obtained by said delay observation means falls outside of said predetermined range or falls in another predetermined range.

76. The semiconductor integrated circuit device according to claim 59, wherein said threshold voltage control means varies a floating gate voltage of a floating gate transistor.

77. The semiconductor integrated circuit device according to claim 59, wherein said threshold voltage control means varies voltages of some of gates of a multigate structure transistor.

* * * * *